(12) United States Patent
Seo et al.

(10) Patent No.: US 11,373,813 B2
(45) Date of Patent: Jun. 28, 2022

(54) PEROVSKITE SOLAR CELL WITH WIDE BAND-GAP AND FABRICATION METHOD THEREOF

(71) Applicant: KOREA RESEARCH INSTITUTE OF CHEMICAL TECHNOLOGY, Daejeon (KR)

(72) Inventors: Jang Won Seo, Seoul (KR); Nam Joong Jeon, Gwangju (KR); Tae Youl Yang, Daejeon (KR); Jun Hong Noh, Daejeon (KR); Eui Hyuk Jung, Seoul (KR)

(73) Assignee: KOREA RESEARCH INSTITUTE OF CHEMICAL TECHNOLOGY, Daejeon (KR)

( * ) Notice: Subject to any disclaimer, the term of this patent is extended or adjusted under 35 U.S.C. 154(b) by 79 days.

(21) Appl. No.: 16/011,387

(22) Filed: Jun. 18, 2018

(65) Prior Publication Data
US 2018/0366277 A1 Dec. 20, 2018

(30) Foreign Application Priority Data
Jun. 16, 2017 (KR) .................. 10-2017-0076696

(51) Int. Cl.
*H01G 9/20* (2006.01)
*H01L 51/42* (2006.01)
*H01L 51/00* (2006.01)

(52) U.S. Cl.
CPC ....... *H01G 9/2009* (2013.01); *H01L 51/0077* (2013.01); *H01L 51/424* (2013.01); *H01L 51/4206* (2013.01)

(58) Field of Classification Search
None
See application file for complete search history.

(56) References Cited

FOREIGN PATENT DOCUMENTS

| CN | 105489775 A | * | 4/2016 |
|----|----|----|----|
| KR | 10-2014-0035284 A | | 3/2014 |
| KR | 10-1547870 B1 | | 8/2015 |
| KR | 10-1547877 B1 | | 8/2015 |
| KR | 10-2016-0090845 A | | 8/2016 |
| KR | 10-2017-0026513 A | | 3/2017 |

OTHER PUBLICATIONS

CN 105489775 Eng Translation, accessed May 22, 2016.*
(Continued)

*Primary Examiner* — Shannon M Gardner
(74) *Attorney, Agent, or Firm* — Knobbe, Martens, Olson & Bear LLP

(57) ABSTRACT

Provided is a perovskite solar cell, and more particularly, a perovskite solar cell including an organometal halide layer having a perovskite structure; and a crystalline material layer stacked while forming an interface with the organometal halide layer, wherein a crystalline material of the crystalline material layer is a crystalline halide having a crystal structure different from the perovskite structure, and the crystalline halide has a band gap energy higher than a band gap energy of an organometal halide of the organometal halide layer, and has a valence band maximum energy level lower than a valence band maximum energy level of the organometal halide.

10 Claims, 17 Drawing Sheets

(56) References Cited

OTHER PUBLICATIONS

Extended European Search Report of corresponding Patent Application No. 18177998.4—7 pages (dated Nov. 16, 2018).
Cao et al., "2D Homologous Perovskites as Light-Absorbing Materials for Solar Cell Applications", Journal of the American Chemical Society, vol. 137—8 pages (2015).
Hu et al., "Hybrid Perovskite/Perovskite Heterojunction Solar Cells", ACS Nano, vol. 10—9 pages (2016).

\* cited by examiner

PEROVSKITE SOLAR CELL WITH WIDE BAND-GAP AND FABRICATION METHOD THEREOF

CROSS-REFERENCE TO RELATED APPLICATIONS

This application claims priority under 35 U.S.C. § 119 to Korean Patent Application No. 10-2017-0076696, filed on Jun. 16, 2017, in the Korean Intellectual Property Office, the disclosure of which is incorporated herein by reference in its entirety.

TECHNICAL FIELD

The following disclosure relates to a perovskite solar cell with a wide band-gap and a fabrication method thereof, and more particularly, to a perovskite solar cell in which an efficiency of extracting light charges is increased, and deterioration due to an external environment including moisture is prevented, and a fabrication method thereof.

BACKGROUND

An organometal halide having a perovskite structure, also referred to as an organometal halide perovskite compound or an organic/inorganic organometal halide is a substance including an organic cation (A), a metal cation (M), and a halogen anion (X), and being represented by Chemical Formula $AMX_3$.

Currently, a perovskite solar cell using the organic/inorganic organometal halide as a light absorber is the most commercialized among next generation solar cells including dye sensitized and organic solar cells, and has been reported to have an efficiency up to 20% (Korea Patent Laid-Open Publication No. 2014-0035284), and thus an interest in the organic/inorganic organometal halide is more increasing.

These perovskite solar cells have a very low material cost while having efficiency comparable to those of silicon solar cells to thereby be usable in a low temperature process or a low-cost solution process, thus being excellent in commercialization. However, hysteresis is large and rapid deterioration occurs. Thus, in order to commercialize the battery, it is required to develop a technology capable of improving stability and lifespan of the battery.

The disclosure of this section is to provide background of the invention. Applicant notes that this section may contain information available before this application. However, by providing this section, Applicant does not admit that any information contained in this section constitutes prior art.

RELATED ART DOCUMENT

Korean Patent Laid-Open Publication No. 2014-0035284

SUMMARY

An embodiment of the present invention is directed to providing a perovskite solar cell having improved stability and lifespan.

Another embodiment of the present invention is directed to providing a perovskite solar cell having excellent photoelectric conversion efficiency even without containing an additive which is a main cause of deterioration together with moisture.

Still another embodiment of the present invention is directed to providing a fabrication method of a perovskite solar cell having improved stability and lifespan by using a simple solution coating method.

In one general aspect, a perovskite solar cell includes: an organometal halide layer having a perovskite structure; and a crystalline material layer stacked while forming an interface with the organometal halide layer, wherein a crystalline material of the crystalline material layer is a crystalline halide having a crystal structure different from the perovskite structure, and the crystalline halide has a band gap energy higher than a band gap energy of an organometal halide of the organometal halide layer, and has a valence band maximum energy level lower than a valence band maximum energy level of the organometal halide.

The crystalline halide may contain a second organometal halide of the same kind as or different kind from the organometal halide of the organometal halide layer.

The crystalline halide may have a diffraction peak present in a region where a diffraction angle $2\theta$ is 4° to 6° on an X-ray diffraction pattern using a Cu K$\alpha$ line.

The crystalline halide may be a reaction product between a second organometal halide of the same kind as or different kind from the organometal halide of the organometal halide layer and a quaternary ammonium salt satisfying Chemical Formula 1 below:

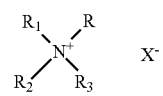

(Chemical Formula 1)

in Chemical Formula 1, R is C5-C10 alkyl, R1, R2 and R3 are each independently C1-C3 alkyl, and X is halogen.

In Chemical Formula 1, R1, R2, and R3 may be each methyl.

The second organometal halide may be the same kind as the organometal halide of the organometal halide layer, and the reaction product may be fabricated by applying a solution of the quaternary ammonium salt to the organometal halide layer, followed by thermal treatment.

The crystalline halide may contain 0.2 to 0.4 mol of a quaternary ammonium salt satisfying Chemical Formula 1 below relative to 1 mol of the second organometal halide:

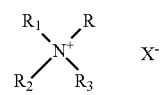

(Chemical Formula 1)

in Chemical Formula 1, R is C5-C10 alkyl, R1, R2 and R3 are each independently C1-C3 alkyl, and X is halogen.

The crystalline halide may have a band gap energy of 2.00 to 2.50 (eV).

The crystalline material layer may have a thickness of 1 nm to 10 nm.

The perovskite solar cell may further include: an electron transport structure disposed under the organometal halide layer.

The perovskite solar cell may further include: an electrode disposed on the crystalline material layer, wherein the electrode is disposed in contact with the crystalline material layer, or faces the crystalline material layer having a hole transport structure interposed therebetween.

The perovskite solar cell may further include: a hole transport structure disposed on the crystalline material layer, and the hole transport structure may include polyalkyl thiophene.

In another general aspect, there is provided a crystalline halide which is a reaction product between an organometal halide layer having a perovskite structure and a quaternary ammonium salt satisfying Chemical Formula 1 below and has a diffraction peak present in a region where a diffraction angle 2θ is 4° to 6° on an X-ray diffraction pattern using a Cu Kα line:

(Chemical Formula 1)

in Chemical Formula 1, R is C5-C10 alkyl, R1, R2 and R3 are each independently C1-C3 alkyl, and X is halogen.

In still another general aspect, a fabrication method of a perovskite solar cell includes applying a solution of a quaternary ammonium salt satisfying Chemical Formula 1 to an organometal halide layer having a perovskite structure, followed by thermal treatment:

(Chemical Formula 1)

in Chemical Formula 1, R is C5-C10 alkyl, R1, R2 and R3 are each independently C1-C3 alkyl, and X is halogen.

A quaternary ammonium salt of the quaternary ammonium salt solution may have a concentration of 0.1 mM to 10 mM.

The thermal treatment may be performed at a temperature of 50 to 200° C.

In still another general aspect, there is provided a fabrication method of a crystalline halide including: preparing a precursor solution in which an organometal halide having a perovskite structure and a quaternary ammonium salt satisfying Chemical Formula 1 are dissolved; and volatilizing and removing a solvent of the prepared precursor solution to obtain a solid phase, followed by thermal treatment, thereby fabricating a crystalline halide having a diffraction peak present in a region where a diffraction angle 2θ is 4° to 6° on an X-ray diffraction pattern using a Cu Kα line.

DETAILED DESCRIPTION OF EMBODIMENTS

Hereinafter, a perovskite solar cell of embodiments of the present invention and a fabrication method thereof will be described in detail with reference to the accompanying drawings. The drawings to be described below are provided by way of example so that the idea of the present invention can be sufficiently transferred to those skilled in the art to which the present invention pertains. Therefore, the present invention may be implemented in many different forms, without being limited to the drawings to be described below. The drawings may be exaggerated in order to specify the spirit of the present invention. Meanwhile, unless technical and scientific terms used herein are defined otherwise, they have meanings understood by those skilled in the art to which the present invention pertains. Known functions and components will be omitted so as not to obscure the description of embodiments of the present invention with unnecessary detail.

In embodiments of the present invention, a perovskite solar cell means a solar cell containing an organometal halide having a perovskite structure as a light absorber.

The perovskite solar cell according to embodiments of the present invention includes: an organometal halide layer having a perovskite structure; and a crystalline material layer stacked while forming an interface with the organometal halide layer, wherein a crystalline material of the crystalline material layer is a crystalline halide having a crystal structure different from the perovskite structure, and the crystalline halide has a band gap energy higher than a band gap energy of an organometal halide of the organometal halide layer, and has a valence band maximum energy level lower than a valence band maximum energy level of the organometal halide.

In the perovskite solar cell according to embodiments of the present invention, the crystalline material layer has a band gap energy relatively higher than that of the organometal halide layer as the light absorbing layer, and simultaneously has a valence band maximum energy level relatively lower than a valence band maximum energy level of the organometal halide. Accordingly, in the perovskite solar cell according to embodiments of the present invention, recombination of photoelectrons and photoholes may be suppressed by an energy barrier provided by the crystalline material layer.

Further, since the crystalline material of the crystalline material layer is a crystalline halide having a crystal structure different from that of the perovskite structure, both the light absorbing layer and the crystalline material layer are halides. Accordingly, the light absorbing layer and the crystalline material layer providing a wide band-gap (Gap) have similar physical properties such as thermal expansion coefficient, and thus there is an advantage in that stability of the solar cell may be improved.

Figure 1:
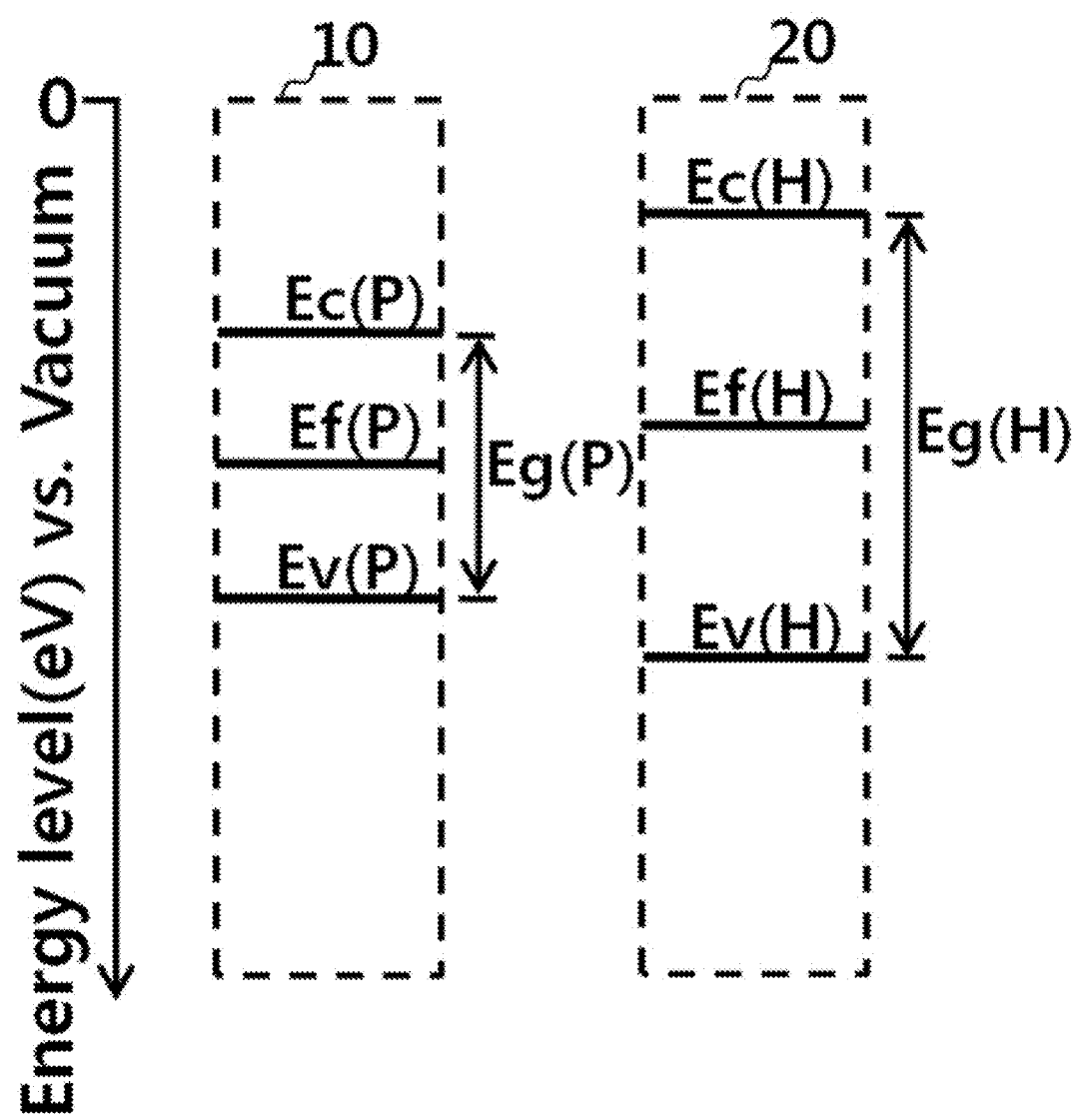
FIG. 1 shows an example of an energy band diagram of an organometal halide layer which is a light absorbing layer and a crystalline material layer according to an embodiment of the present invention.

In detail, FIG. 1 shows an example of an energy band diagram of an organometal halide layer 10 which is a light absorbing layer and a crystalline material layer 20 on the basis 0 of an electron energy level (eV) under vacuum.

As shown in FIG. 1, in the perovskite solar cell according to embodiments of the present invention, a band gap energy Eg(H), eV of the crystalline material layer 20 is higher than a band gap energy Eg(P), eV of the organometal halide layer 10, and a valence band maximum energy level Ev(H), eV of the crystalline material layer 20 is relatively lower than a valence band maximum energy level Ev(P), eV of the organometal halide layer 10.

In addition, in the example shown in FIG. 1, in view of effectively providing an energy barrier to prevent the recombination, advantageously, a conduction band minimum energy level Ec(H), eV of the crystalline material layer 20 may be relatively higher than a conduction band minimum energy level Ec(P), eV of the organometal halide layer 10. In other words, the Fermi energy level Ef(H), eV of the crystalline material layer 20 may be relatively higher than the Fermi energy level Ef(P), eV of the organometal halide layer 10.

As described above, the crystalline material layer 20 with a wide band-gap may prevent extinction by recombination of the photoelectrons and photoholes, thereby increasing a photoelectric conversion efficiency of the solar cell.

When the Eg(H) is relatively larger than the Eg(P) and the Ev(H) is relatively lower than the Ev(P), an effect of preventing the recombination by the crystalline material layer 20 may be exhibited. However, in view of providing a more effective energy barrier by the wide band-gap, a difference in energy level between Ev(H) and Ev(P) may be 0.1 eV or more, and may be substantially 0.1 to 0.3 eV. In addition, the difference between Eg(H) and Eg(P) may exceed 0.1 eV, and may be substantially 0.3 eV to 0.8 eV.

In the solar cell according to an embodiment of the present invention, the crystalline material layer with a wide band-gap is a crystalline halide having a crystal structure different from that of the perovskite structure, and the crystalline halide may contain a second organometal halide of the same kind as or different kind from the organometal halide of the organometal halide layer.

The crystalline halide may contain the second organometal halide, and thus stability of the solar cell may be more improved, and the crystalline material layer may have excellent compatibility with the organometal halide layer as the light absorbing layer. By this compatibility, it is possible to form the crystalline material layer with a wide band-gap directly on the light absorbing layer during a fabrication process of a solar cell. This compatibility is further increased when the crystalline material layer contains the second organometal halide of the same kind as the organometal halide of the organometal halide layer.

Independently from containing the second organometal halide, or advantageously containing the second organometal halide, the crystalline halide may be a halide having a diffraction peak present in a region where a diffraction angle 2θ is 4° to 6° on an X-ray diffraction pattern using a Cu Kα line. Here, the crystal structure different from the perovskite structure means a structure in which the diffraction peak is disposed in the region where the diffraction angle 2θ is 4° to 6° on the X-ray diffraction pattern using the Cu Kα line of the crystalline halide.

Further, the crystalline halide may be a reaction product between the second organometal halide and a quaternary ammonium salt having a halogen as an anion. Specifically, the crystalline halide may be a crystalline reaction product containing the quaternary ammonium salt and the second organometal halide wherein at least a quaternary ammonium ion is bonded and disposed within a structure of the second organometal halide.

Advantageously, the quaternary ammonium salt may satisfy Chemical Formula 1 below:

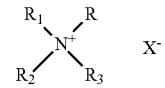

(Chemical Formula 1)

in Chemical Formula 1, R is C5-C10 alkyl, R1, R2 and R3 are each independently C1-C3 alkyl, and X is halogen. Here, X may be one or two or more selected from F, Cl, Br and I.

Since the quaternary ammonium salt satisfying Chemical Formula 1 is in a salt form of a tetraalkylammonium cation and a halogen anion, the quaternary ammonium salt may have strong reactivity and be inserted between layers of the second organometal halide to form a crystalline compound having a different crystal structure rather than the perovskite structure of the second organometal halide itself.

Specifically, in the quaternary ammonium salt satisfying Chemical Formula 1, the trialkylammonium cation moiety of R1, R2 and R3 and N+ may be a reactive moiety bonding with the second organometal halide. In addition, R having a relatively long alkyl chain as compared to R1, R2, and R3 may impart hydrophobicity to the crystalline halide and increase the energy band gap of the crystalline halide.

In an advantageous example, it is preferable that R1, R2 and R3 in Chemical Formula 1 are each methyl. In this case, the reactive moiety of the trialkylammonium cation may have such a large reactivity that the crystalline halide of several to several tens of nanometers is able to be fabricated only by simply contacting the quaternary ammonium salt with the second organometal halide in a solid state, followed by low temperature thermal treatment of 200° C. or less.

Further, in an advantageous example, in Chemical Formula 1, R is preferably (C5-C10)alkyl, advantageously (C5-C7)alkyl so that the crystalline halide is disposed to be easily bonded between the layers of the second organometal halide as described above while having a large hydrophobicity.

Figure 2:
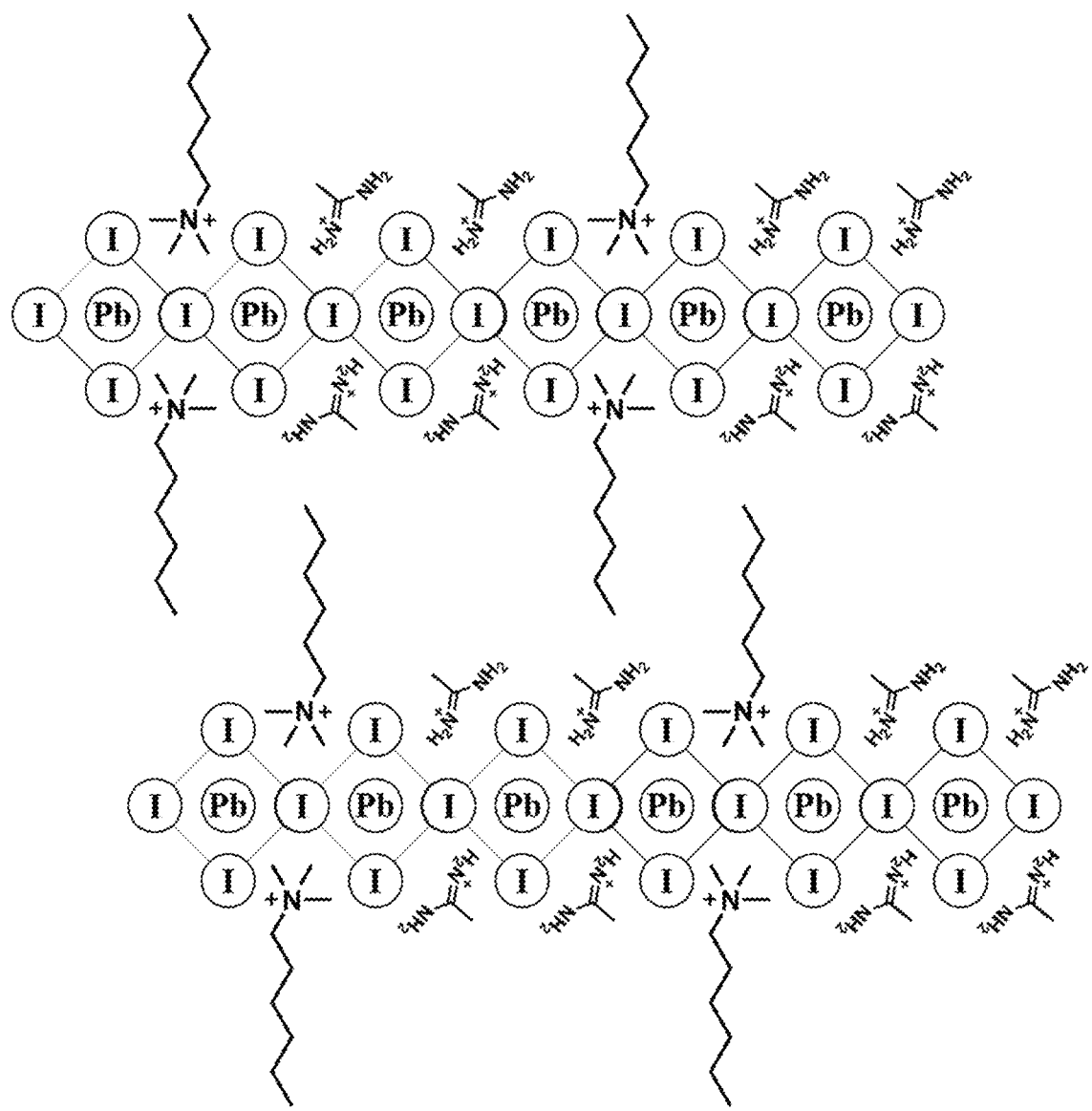
FIG. 2 is a schematic diagram showing a structure of a crystalline halide fabricated by a reaction of an organometal halide with the quaternary ammonium salt in an embodiment of the present invention.

FIG. 2 is a schematic diagram showing a structure of the crystalline halide fabricated by a reaction of a second organic halide of $AMX_3$ (A=a monovalent organic cation, M=a divalent metal ion, X=a halogen anion) with a quaternary ammonium salt, showing an example of (N-hexyl) trimethylammonium bromide in which R1, R2 and R3 are all methyl and R is C6 alkyl according to an advantageous example.

As known in the art, the perovskite structure is a structure in which in a unit cell, a metal cation, M, is disposed at the center of the unit cell, a halogen anion X is disposed at the center of each side of the unit cell to form an octahedron structure based on M, and an organic cation A is disposed at each corner of the unit cell. Again, the organic cation A may be disposed in the middle in a three-dimensional network in which the MX6 octahedron is corner-sheared. In other words, the perovskite structure is a structure in which in the unit cell, the halogen anion X forms an octahedron in the form of MX6 based on the metal cation M, and the organic cation A is disposed at each corner of the outer side of the octahedron.

Thus, the second organometal halide (AMX3, where A=monovalent organic cation, M=divalent metal ion, and X=halogen anion) having a perovskite structure may have a layer by layer form based on M, and the tetraalkylammonium ion of the quaternary ammonium salt may be inserted between the layers of the second organometal halide, and thus the above-described reactive moiety may bind to the second organometal halide and at the same time, the hydrophobic moiety R may be disposed between layers to form a new crystal. Here, the halogen anion derived from the quaternary ammonium salt may be mixed with a halogen anion site of the second organometal halide, or may be regularly or irregularly disposed in a space between crystals of the crystalline halide, or may be in a state of being removed by vaporization at the time of thermal treatment for forming a crystalline material layer as described below. When removed by vaporization, the crystalline halide may be interpreted as containing a tetraalkylammonium ion together with the second organometal halide.

When the crystalline material layer is a crystalline halide which is the reaction product between the second organometal halide and the quaternary ammonium salt satisfying the above-described Chemical Formula 1, the crystalline material layer may have a band gap energy of 2.00 to 2.50 (eV), such that recombination of photoelectrons and photoholes may be effectively suppressed by the wide band-gap. In addition, when the crystalline material layer is the reaction product between the second organometal halide and the quaternary ammonium salt satisfying the above-described Chemical Formula 1, surface defect of the organometal halide layer as the light absorbing layer may be healed by the crystalline material layer to remarkably improve photoelectric efficiency. Further, when the crystalline material layer is the reaction product between the second organometal halide and the quaternary ammonium salt satisfying the above-described Chemical Formula 1, even though energy barrier is formed by the wide band-gap, an extraction efficiency of photoelectric charge from the organometal halide layer can be remarkably improved by the crystalline material layer. In particular, when the crystalline material layer is the reaction product between the second organometal halide and the quaternary ammonium salt satisfying the above-described Chemical Formula 1, deterioration of the organometal halide layer due to moisture and heat, etc., may be surprisingly suppressed, thereby greatly improving stability and lifespan of the solar cell.

The crystalline halide having the advantageous effects described above may be the reaction product between the second organometal halide and the quaternary ammonium salt satisfying Chemical Formula 1, and advantageously a reaction product between the second organometal halide and the quaternary ammonium salt wherein R1, R2 and R3 are each methyl and R is (C5-C7)alkyl. Crystallographically, the crystalline halide (reaction product) having the favorable effect described above may have a diffraction peak disposed in a region where a diffraction angle $2\theta$ is 4° to 6°, and at the same time may have a diffraction peak disposed in a region where the diffraction angle $2\theta$ is 16° to 18°, and a region where the diffraction angle $2\theta$ is 22.5° to 23.5°, respectively, on an X-ray diffraction pattern using a Cu K$\alpha$ line of the crystalline halide. Here, in the range where the diffraction angle $2\theta$ is 2° to 40°, an intensity of the diffraction peak disposed in the region where the diffraction angle $2\theta$ is 4° to 6° among peaks present on the X-ray diffraction pattern of the crystalline halide, may be relatively great.

Further, as described above, the tetraalkylammonium ion of the quaternary ammonium salt may be inserted between the layers of the second organometal halide to be bonded. Here, as shown in the schematic diagram of FIG. 2, the tetraalkylammonium ions may be disposed between layers between multiple layers rather than between layers of a single layer. Accordingly, peaks due to the perovskite structure of the second organometal halide on the X-ray diffraction pattern using the Cu K$\alpha$ Line of the crystalline halide may be partially disposed. In detail, the crystalline halide may further include a diffraction peak derived from the perovskite structure disposed in the region of 13.5° to 14.5° and/or in the region of 27.5° to 28.5° on the X-ray diffraction pattern using the Cu K$\alpha$ line of the crystalline halide. As a specific and practical example, the crystalline halide may include diffraction peaks disposed in the region where the diffraction angle $2\theta$ is 4° to 6°, the region where the diffraction angle $2\theta$ is 16° to 18°, the region where the diffraction angle $2\theta$ is 22.5° to 23.5°, the region where the diffraction angle $2\theta$ is 13.5° to 14.5°, the region where the diffraction angle $2\theta$ is 27.5° to 28.5°, respectively, on the X-ray diffraction pattern using the Cu K$\alpha$ line of the crystalline halide, and in the range where $2\theta$ is 2° to 40°, the intensity of the diffraction peak disposed in the region where the diffraction angle $2\theta$ is 4° to 6° among peaks present on the X-ray diffraction pattern of the crystalline halide, may be relatively great.

In the solar cell according to an embodiment of the present invention, advantageously, the crystalline halide may contain 0.2 to 0.4 mol, specifically 0.25 to 0.35 mol of the quaternary ammonium salt satisfying Chemical Formula 1 or may contain 0.2 to 0.4 mol, specifically 0.25 to 0.35 mol quaternary ammonium ion of Chemical Formula 1 described above relative to 1 mol of the second organometal halide. This molar ratio is the number of moles in which the crystal structure different from the perovskite structure, that is, a crystal structure having the above-described X-ray diffraction pattern is able to be stably formed.

In view of the fabrication method, the crystalline halide, that is, the reaction product may be fabricated by contacting the second organometal halide with the quaternary ammonium salt satisfying Chemical Formula 1, followed by thermal treatment. Since a simple contact in which the thermal treatment is not performed does not fabricate the crystalline halide, it is preferable that the thermal treatment is necessarily performed. Here, it is preferable that the thermal treatment is a low temperature thermal treatment at 50 to 200° C., advantageously 100 to 150° C. in order to create a smooth reaction and to prevent a material damage caused by thermal energy.

Further, when the crystalline material layer contains a second organometal halide of the same kind as the organometal halide of the organometal halide layer, compatibility is further increased and it is more advantageous for healing surface defects of the organometal halide layer, and thus the quaternary ammonium salt satisfying Chemical Formula 1 may be directly brought into contact with the organometal halide layer, which is a light absorbing layer, followed by thermal treatment to fabricate the crystalline material layer.

As a specific example, the contact between the organometal halide layer and the quaternary ammonium salt satisfying Chemical Formula 1 may be performed in a liquid medium. Specifically, the contact may be performed by applying a solution in which the quaternary ammonium salt satisfying Chemical Formula 1 is dissolved (hereinafter referred to as a quaternary ammonium salt solution) in the organometal halide layer which is a light absorbing layer. A drying step for removing the solvent of the quaternary ammonium salt solution before the thermal treatment may be further performed, but since the drying may be performed simultaneously during the thermal treatment for the reaction after the contact, the drying may be optionally performed. When the drying is further performed, a drying temperature may be any temperature as long as it is a temperature at which the solvent of the quaternary ammonium salt solution is volatilized and removed easily, and specifically, may be room temperature to 45° C., but is not limited thereto.

In the solar cell according to an embodiment of the present invention, a thickness of the crystalline material layer may be 1 nm to 10 nm, and may be 3 nm to 10 nm so that effects of providing energy barrier, preventing moisture deterioration, and increasing extraction efficiency of photoelectric charge may be stably exhibited.

In the solar cell according to an embodiment of the present invention, the organometal halide and the second organometal halide of the organometallic halide layer which is the light absorbing layer, may independently satisfy Chemical Formula 2 below:

$$AMX_3 \qquad \text{[Chemical Formula 2]}$$

in Chemical Formula 2, A is a monovalent organic cation, M is a divalent metal ion, and X may be one or two or more selected from I$^-$, Br$^-$, F$^-$, and Cl$^-$. Examples of the M which is the divalent metal ion may include one or two or more metal ions selected from Cu$^{2+}$, Ni$^{2+}$, Co$^{2+}$, Fe$^{2+}$, Mn$^{2+}$, Cr$^{2+}$, Pd$^{2+}$, Cd$^{2+}$, Ge$^{2+}$, Sn$^{2+}$, Pb$^{2+}$, and Yb$^{2+}$, but the M is not limited thereto. A may be an amidinium group ion, an organic ammonium ion or an amidinium group ion and an organic ammonium ion. The organoammonium ion may satisfy Chemical Formula represented by $(R_1-NH_{3+})X$ (wherein $R_1$ is C1-C24 alkyl, C3-C20 cycloalkyl or C6-C20 aryl, and X is one or two or more halogen ions selected from Cl$^-$, Br$^-$, F$^-$, and I$^-$) or Chemical Formula represented by $(R_2-C_3H_3N_2{}^+-R_3)X$ (wherein $R_2$ is C1-C24 alkyl, C3-C20 cycloalkyl or C6-C20 aryl, $R_3$ is hydrogen or C1-C24 alkyl, and X is one or two or more halogen ions selected from Cl$^-$, Br$^-$, F$^-$, and I$^-$). As a non-limiting and specific example, $R_1$ may be C1-C24 alkyl, preferably C1-C7 alkyl, and more preferably, methyl. $R_2$ may be C1-C24 alkyl, $R_3$ may be hydrogen or C1-C24 alkyl, preferably $R_2$ may be C1-C7 alkyl, $R_3$ may be hydrogen or C1-C7 alkyl, and more preferably, $R_2$ may be methyl, and $R_3$ may be hydrogen.

The amidinium group ion may satisfy Chemical Formula below:

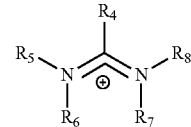

[Chemical Formula]

in Chemical Formula above, $R_4$ to $R_8$ are each independently hydrogen, C1-C24 alkyl, C3-C20 cycloalkyl or C6-C20 aryl. As a non-limiting and specific example, in consideration of absorption of sunlight, $R_4$ to $R_8$ may be each independently hydrogen, amino or C1-C24 alkyl, specifically, hydrogen, amino or C1-C7 alkyl, and more specifically, hydrogen, amino or methyl. More specifically, $R_4$ may be hydrogen, amino or methyl, and $R_5$ to $R_8$ may be hydrogen. As a specific and non-limiting example, the amidinium group ion may include a formamidinium ion ($NH_2CH=NH_2{}^+$), an acetamidinium ion ($NH_2C(CH_3)=NH_2{}^+$), a guamidinium ion ($NH_2C(NH_2)=NH_2{}^+$), or the like.

As described above, the monovalent organic ion (A) of the organic halide may be a monovalent organic ammonium ion represented by $R_1-NH_3{}^+$ or $R_2-C_3H_3N_2{}^+-R_3$ described above, the amidinium group ion described above based on Chemical Formula, or the organic ammonium ion and the amidinium group ion.

When the monovalent organic ion includes both the organic ammonium ion and the amidinium group ion, the organic halide may satisfy Chemical Formula $A'_{1-x}A_xX$ (wherein A is the monovalent organic ammonium ion described above, and A' is the amidinium group ion described above, and X is one or two or more halogen ions selected from I$^-$, Br$^-$, F$^-$ and Cl$^-$, and x is a real number with 0<x<1, preferably a real number with 0.05≤x≤0.3). When the monovalent organic ion contains 0.7 to 0.95 of the amidinium group ion and 0.3 to 0.05 of the organic ammonium ion assuming that a total number of moles of the monovalent organic cation is 1, it is advantageous since it is possible to absorb light in a very wide wavelength band and to perform faster migration and separation of exciton, and faster migration of photoelectrons and photoholes.

Figure 3:
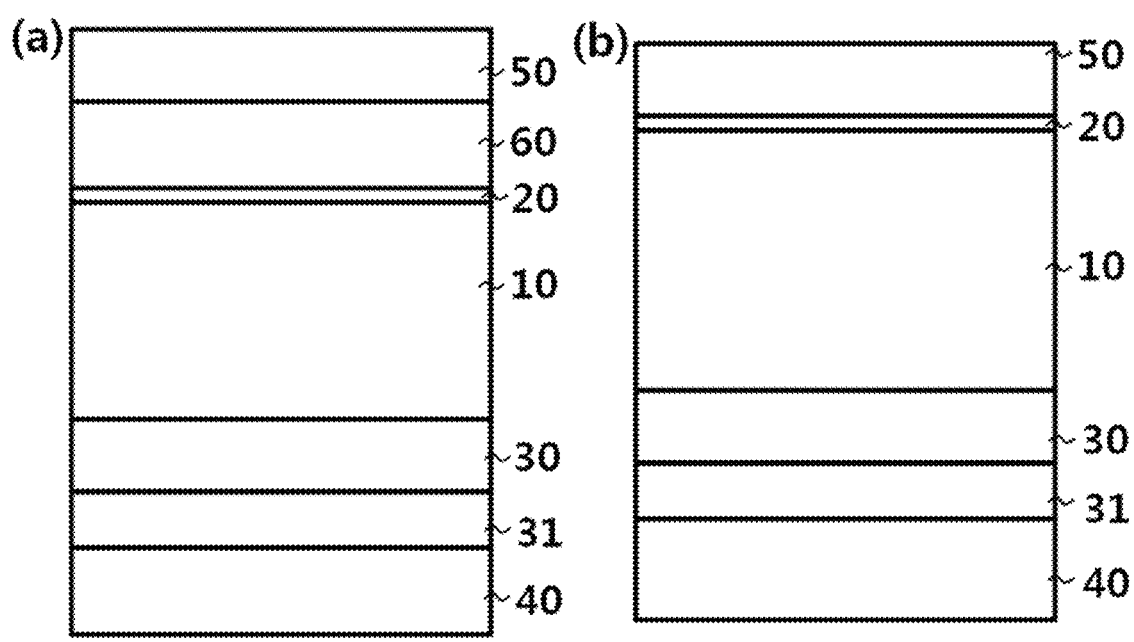
FIG. 3 is a cross-sectional view showing a structure of a solar cell according to an embodiment of the present invention.

FIG. 3 is a cross-sectional view showing a structure of a solar cell according to an embodiment of the present invention. As in an example shown in FIG. 3, the solar cell according to an embodiment of the present invention may further include an electron transport structure 30 disposed under the organometal halide layer 10. The electron transport structure 30 may be an electron conductive organic material layer or an electron conductive inorganic material layer. The electron conductive organic material may be an organic material used as an n-type semiconductor in typical organic solar cells. As a specific and non-limiting example, the electron conductive organic material may include fullerenes (C60, C70, C74, C76, C78, C82, C95), fullerene derivatives including PCBM ([6,6]-phenyl-C61butyric acid methyl ester)), C71-PCBM, C84-PCBM, PC$_{70}$BM ([6,6]-phenyl C70-butyric acid methyl ester), PBI (polybenzimidazole), PTCBI (3,4,9,10-perylenetetracarboxylic bisbenzimidazole), F4-TCNQ (tetra uorotetracyanoquinodimethane or a mixture thereof. The electron conductive inorganic material may be an electron conductive metal oxide used for electron transfer in a typical quantum dot-based solar cell, a dye-sensitized solar cell or a perovskite solar cell. As a specific example, the electron conductive metal oxide may be an n-type metal oxide semiconductor. As a specific example, the n-type metal oxide may be one or two or more material selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, In oxide and SrTi oxide, and may be a mixture thereof or a composite thereof. In the structure, the electron transport structure may be a porous layer (porous film) or a dense layer (dense film). The dense electron transport structure may be a film of the electron conductive organic material or a dense film of the electron conductive inorganic material as described above. The porous electron transport structure may be a porous film formed of particles of the above-described electron conductive inorganic material. The electron transport structure may have a thickness of 50 nm to 10 μm, specifically 50 nm to 1000 nm. When the electron transport structure is porous, a specific surface area may be 10 to 100 $m^2/g$, and an average diameter of the metal oxide particles forming the electron transport structure may be 5 to 500 nm. A porosity (apparent porosity) of the porous electron transport structure may be 30% to 65%, and specifically 40% to 60%. In addition, when the electron transport structure 30 is a porous structure, pores of the electron transport structure may be filled with the organometal halide of the organometal halide layer.

When the electron transport structure 30 has a porous structure, an electron transport film 31 may be further provided under the electron transport structure 30. The electron transport film 31 may serve to prevent contact between the organometal halide and the electrode and to transport electrons. As a non-limiting and specific example, the electron transport film 31 may be a metal oxide thin film, and the metal oxide of the metal oxide thin film may be the same or different from the metal oxide of the porous metal oxide. In detail, a material of the metal oxide thin film may be one or more materials selected from Ti oxide, Zn oxide, In oxide, Sn oxide, W oxide, Nb oxide, Mo oxide, Mg oxide, Ba oxide, Zr oxide, Sr oxide, Yr oxide, La oxide, V oxide, Al oxide, Y oxide, Sc oxide, Sm oxide, Ga oxide, In oxide, SrTi oxide, ZnSn oxide, a mixture thereof, and a composite thereof. A thickness of the electron transport film may be substantially 10 nm or more, more substantially 10 nm to 100 nm, and further more substantially 50 nm to 100 nm.

A first electrode 40 may be disposed under the electron transport structure 30 or the electron transport film 31. In this case, the first electrode 40 may be disposed on a first substrate which is a support. The first substrate may be a rigid substrate or a flexible substrate. As a specific example, the first substrate may be a rigid substrate including a glass substrate or a flexible substrate including polyethylene terephthalate (PET); polyethylene naphthalate (PEN); polyimide (PI); polycarbonate (PC); polypropylene (PP); triacetylcellulose (TAC); polyether sulfone (PES), etc. However, the present invention is not limited by the kind of the first substrate.

The first electrode 40 is any conductive electrode that is ohmic-bonded to the electron transport structure, and a material thereof may be any material commonly used as an electrode material of a front electrode or a rear electrode in a solar cell. As a non-limiting example, when the first electrode 40 is an electrode material of the rear electrode, the first electrode 40 may be one or more materials selected from gold, silver, platinum, palladium, copper, aluminum, carbon, cobalt sulfide, copper sulfide, nickel oxide, and a composite thereof. As a non-limiting example, when the first electrode 40 is a transparent electrode, the first electrode may be an inorganic conductive electrode such as fluorine doped tin oxide (FTO), indium doped tin oxide (ITO), ZnO, carbon nanotube (CNT), graphene, etc., or an organic conductive metal such as PEDOT:PSS. When a transparent solar cell is attempted to be provided, it is preferable that both the electrode and the substrate are a transparent electrode and a transparent substrate.

The solar cell may further include a second electrode disposed on the crystalline material layer 10, and the second electrode may be an opposite electrode of the first electrode. As in an example shown in (a) of FIG. 3, the second electrode 50 may be disposed to face the crystalline material layer 20 with a hole transport structure 60 interposed therebetween. Alternatively, as in an example shown in (b) of FIG. 3, the second electrode 50 may be disposed in contact with the crystalline material layer 20 without a separate hole transport structure.

The hole transport structure 60 may be an organic hole transport structure, an inorganic hole transport structure, or a laminate thereof, but may be an organic hole transport structure which is able to be fabricated by a solution process and has excellent hole transporting properties.

The hole transport structure may include an organic hole transport material, specifically, a monomolecular or polymeric organic hole transport material (hole transport organic material). The organic hole transport material may be any organic hole transport material as long as it is used in a typical inorganic semiconductor-based solar cell or a perovskite solar cell using an inorganic semiconductor quantum dot as dye. However, in view of energy matching and stability with a light absorber which is an organometal halide, a polymeric organic hole transport material is preferable.

A non-limiting example of the monomolecular to low-molecular organic hole transport material may be one or two or more materials selected from pentacene, coumarin 6 [3-(2-benzothiazolyl)-7-(diethylamino)coumarin], ZnPC (zinc phthalocyanine), CuPC (copper phthalocyanine), TiOPC (titanium oxide phthalocyanine), spiro-MeOTAD (2,2',7,7'-tetrakis(N,N-p-dimethoxyphenylamino)-9,9'-spirobifluorene), F16CuPC (copper(II) 1,2,3,4,8,9,10,11,15,16, 17,18,22,23,24,25-hexadecafluoro-29H,31H-phthalocyanine), SubPc (boron subphthalocyanine chloride), and N3(cis-di(thiocyanato)-bis(2,2'-bipyridyl-4,4'-dicarboxylic acid)-ruthenium(II)), but is not limited thereto.

The organic hole transport material is preferably a polymer (hole conductive polymer), and thus stable solar cell operation may be assured, and further improved power generation efficiency may be obtained by energy matching with the light absorber. Specific examples of the hole conductive polymer may include one or two or more materials selected from a thiophene-based material, a paraphenylene vinylene-based material, a carbazole-based material and a triphenylamine-based material, preferably, one or two or more selected from thiophene-based material, the triphenylamine-based material, and more preferably, a triphenylamine-based material. A non-limiting example of the polymeric organic hole transport material may include one or two or more materials selected from P3HT(poly[3-hexylthiophene]), MDMO-PPV(poly[2-methoxy-5-(3',7'-dimethyloctyloxy)]-1,4-phenylene vinylene), MEH-PPV(poly[2-methoxy-5-(2"-ethylhexyloxy)-p-phenylene vinylene]), P3OT(poly(3-octyl thiophene)), POT(poly(octyl thiophene)), P3DT(poly(3-decyl thiophene)), P3DDT(poly(3-dodecyl thiophene), PPV(poly(p-phenylene vinylene)), TFB (poly(9,9'-dioctylfluorene-co-N-(4-butylphenyl)diphenyl amine), Polyaniline, Spiro-MeOTAD ([2,22',7,77'-tetrkis (N,N-di-p-methoxyphenyl amine)-9,9,9'-spirobi fluorine]), PCPDTBT(Poly[2,1,3-benzothiadiazole-4,7-diyl[4,4-bis(2-ethylhexyl-4H-cyclopenta [2,1-b:3,4-b']dithiophene-2,6-diyl]], Si-PCPDTBT(poly[(4,4'-bis(2-ethylhexyl)dithieno [3,2-b:2',3'-d]silole)-2,6-diyl-alt-(2,1,3-benzothiadiazole)-4, 7-diyl]), PBDTTPD(poly((4,8-diethylhexyloxyl) benzo([1, 2-b:4,5-b']dithiophene)-2,6-diyl)-alt-((5-octylthieno[3,4-c] pyrrole-4,6-dione)-1,3-diyl)), PFDTBT(poly[2,7-(9-(2-ethylhexyl)-9-hexyl-fluorene)-alt-5,5-(4', 7, -di-2-thienyl-2', 1', 3'-benzothiadiazole)]), PFO-DBT(poly[2,7-0.9,9-(dioctyl-fluorene)-alt-5,5-(4',7'-di-2-.thienyl-2', 1', 3'-benzothiadiazole)]), PSiFDTBT(poly[(2,7-dioctylsilafluorene)-2,7-diyl-alt-(4,7-bis(2-thienyl)-2,1,3-benzothiadiazole)-5,5'-diyl]), PSBTBT(poly[(4,4'-bis(2-ethylhexyl)dithieno[3,2-b: 2', 3'-d]silole)-2,6-diyl-alt-(2,1,3-benzothiadiazole)-4,7-diyl]), PCDTBT(Poly [[9-(1-octylnonyl)-9H-carbazole-2,7-diyl]-2,5-thiophenediyl-2,1,3-benzothiadiazole-4,7-diyl-2, 5-thiophenediyl]), PFB(poly(9,9'-dioctylfluorene-co-bis(N, N'-(4,butylphenyl))bis(N,N'-phenyl-1,4-phenylene) diamine), F8BT(poly(9,9'-dioctylfluorene-co-benzothiadazole), PEDOT (poly(3,4-ethylenedioxythiophene)), PEDOT:PSS (poly(3,4-ethylenedioxythiophene) poly(styrenesulfonate)), PTAA (poly(triarylamine)), Poly(4-butylphenyl-diphenyl-amine), and a copolymer thereof.

Advantageously, according to an embodiment of the present invention, when the crystalline material layer contains a quaternary ammonium ion (quaternary ammonium ion derived from a quaternary ammonium salt represented by Chemical Formula I) having a C5-10 long alkyl chain, crystallinity of the organic hole transport material of the hole transport structure may be remarkably improved.

Specifically, when the crystalline material layer contains a quaternary ammonium ion having a C5-10 long alkyl chain, the organic hole transport material of the polyalkyl (C4-C8)thiophene may form a crystalline nanofibril structure and may form a crystalline hole transport structure. The crystalline nanofibril structure is advantageous since charge mobility may be greatly improved. The alkyl group of the polyalkyl(C4-C8)thiophene may be a linear alkyl group, and may be a butyl group, a pentyl group, a hexyl group, a heptyl group, or an octyl group. A representative example of the polyalkyl(C4-C10)thiophene which has a nano-fibril structure due to the crystalline material layer and has excellent hole transport properties may include poly(3-hexylthiophene), but is not limited thereto.

As known in the art, when a solution in which an organic hole transport material of polyalkyl(C4-C10)thiophene is dissolved is applied and dried to form a hole transport layer according to the related art, it is general that an amorphous (amorphous) hole transport layer is formed. Although not limited to this interpretation, according to an embodiment of the present invention, when the crystalline material layer contains a quaternary ammonium ion having a C5-10 long alkyl chain, it is interpreted that the nano-fibril structure is induced by the interaction between the C5-10 long alkyl chain of the crystalline material layer and the alkyl(C4-C10) of the polyalkyl(C4-C10)thiophene.

The hole transport structure may be a thin film of an organic hole transport material, and a thickness of the thin film may be 10 nm to 500 nm, but the present invention is not limited thereto.

Generally, an organic material-based hole conductive layer may contain an additive such as TBP (tertiary butyl pyridine), LiTFSI (lithium bis(trifluoro methanesulfonyl) Imide), and tris(2-(1H-pyrazol-1-yl)pyridine)cobalt (III), or the like, for improving the properties such as conductivity. However, as known in the art, in the case of a perovskite solar cell, deterioration of the battery properties is caused by these additives.

On the other hand, a solar cell according to an embodiment of the present invention may include an organic hole transport structure that does not contain the additive such as TBP (tertiary butyl pyridine), LiTFSI (lithium bis(trifluoro methanesulfonyl)Imide), and tris(2-(1H-pyrazol-1-yl)pyridine)cobalt (III), or the like. That is, the solar cell according to an embodiment of the present invention may include a hole transport structure made of a monomolecular to polymeric organic hole transport material (hole transport organic material). This is because even if an organic hole transport structure without containing an additive is provided, an extremely excellent photoelectric conversion efficiency of 20% or more may be obtained by healing of surface bonding of the light absorbing layer, an increase of photoelectric charge extraction efficiency, and the like, due to the above-described crystalline material layer. Since a constitution of the organic hole transport structure without containing an additive is able to be implemented by the crystalline material layer which significantly improves the photoelectric conversion efficiency, when a high efficiency is preferentially required over stability or lifespan in consideration of the use of the solar cell, an organic hole transport structure containing an additive may be provided, if necessary.

The second electrode 50 is any conductive electrode that is ohmic-bonded to the hole transport structure 60, and a material thereof may be any material commonly used as an electrode material of a front electrode or a rear electrode in a solar cell. As a non-limiting example, when the second electrode is an electrode material of the rear electrode, the second electrode 50 may be one or more materials selected from gold, silver, platinum, palladium, copper, aluminum, carbon, cobalt sulfide, copper sulfide, nickel oxide, and a composite thereof. As a non-limiting example, when the second electrode 50 is a transparent electrode, the second electrode 50 may be an inorganic conductive electrode such as fluorine doped tin oxide (FTO), indium doped tin oxide (ITO), ZnO, carbon nanotube (CNT), graphene, etc., or an organic conductive electrode such as PEDOT:PSS.

Embodiments of the present invention include a crystalline halide. The crystalline halide according to embodiments of the present invention is a reaction product between an organometal halide having a perovskite structure and a quaternary ammonium salt satisfying Chemical Formula 1 below and has a diffraction peak present in a region where a diffraction angle 2θ is 4° to 6° on an X-ray diffraction pattern using a Cu Kα line:

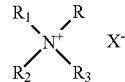

(Chemical Formula 1)

in Chemical Formula 1, R is C5-C10 alkyl, R1, R2 and R3 are each independently C1-C3 alkyl, and X is halogen. Here, X may be one or two or more selected from F, Cl, Br and I.

Specifically, all of R1, R2 and R3 may be preferably methyl and R may be (C5-C10)alkyl, and more preferably, all of R1, R2 and R3 may be methyl and R may be (C5-C7)alkyl so that the crystalline halide has improved moisture resistance and thermal stability and a crystal structure different from the perovskite structure may be stably formed.

Specifically, the crystalline halide may have a diffraction peak disposed in a region where a diffraction angle 2θ is 4° to 6°, and at the same time may have a diffraction peak disposed in a region where the diffraction angle 2θ is 16° to 18°, and a region where the diffraction angle 2θ is 22.5° to 23.5°, respectively, on the X-ray diffraction pattern using the Cu Kα line. Here, in the range where the diffraction angle 2θ is 2° to 40°, an intensity of the diffraction peak disposed in the region where the diffraction angle 2θ is 4° to 6° among peaks present on the X-ray diffraction pattern of the crystalline halide, may be relatively great.

More specifically, the crystalline halide may include some of the peaks due to the perovskite structure of the organometal halide on the X-ray diffraction pattern using the Cu Kα Line. Substantially, the crystalline halide may further include a perovskite structure-derived diffraction peak disposed in the region of 13.5° to 14.5° and/or in the region of 27.5° to 28.5° on the X-ray diffraction pattern using the Cu Kα Line.

The crystalline halide may have an energy band gap relatively larger than an energy band gap of the organometal halide itself (hereinafter referred to as a reference perovskite compound) having a perovskite structure contained in the crystalline halide. As a practical example, the crystalline halide may have a band gap energy of 2.00 to 2.50 (eV).

Specifically, the energy band gap of the crystalline halide is greater than the energy band gap of the reference perovskite compound, and simultaneously, a conduction band minimum energy level of the crystalline halide may be relatively higher than a conduction band minimum energy level of the reference perovskite compound. More specifically, a difference between the energy band gap of the crystalline halide and the reference perovskite compound may exceed 0.1 eV, and as a practical example, may be 0.3 eV to 0.8 eV. In addition, the difference between the conduction band minimum energy level of the crystalline halide and the conduction band minimum energy level of the perovskite compound may be 0.1 eV or more, and as a practical example, may b 0.1 to 0.3 eV.

The crystalline halide may contain 0.2 to 0.4 mol, and more specifically from 0.25 to 0.35 mol of the quaternary ammonium salt satisfying Chemical Formula 1 described above relative to 1 mol of the reference perovskite compound. This molar ratio is the number of moles in which the crystal structure which is different from the perovskite structure and has the above-described X-ray diffraction pattern is able to be stably formed.

Embodiments of the present invention include a fabrication method of the above-described crystalline halide.

The fabrication method of a crystalline halide according to embodiments of the present invention may include preparing a precursor solution in which the organometal halide having a perovskite structure and the quaternary ammonium salt satisfying Chemical Formula 1 described above are dissolved; and volatilizing and removing a solvent of the prepared precursor solution to obtain a solid phase, followed by thermal treatment, thereby fabricating a crystalline halide having a diffraction peak present in the region where the diffraction angle 2θ is 4° to 6° on the X-ray diffraction pattern using a Cu Kα line.

The precursor solution may contain 0.2 to 0.4 mol, more specifically 0.25 to 0.35 mol of the quaternary ammonium salt relative to 1 mol of the organometal halide. When the molar ratio is satisfied, a crystalline halide having a crystal structure different from the perovskite structure may be stably obtained.

A concentration of the organometallic halide and the quaternary ammonium salt in the solution may be any concentration within a solubility limit range as long as the molar ratio of the organometal halide:quaternary ammonium salt satisfies 1:0.2 to 0.4, specifically 1:0.25 to 0.35. As a non-limiting example, the organometal halide of the precursor solution may have a concentration of 0.1 to 0.8 M based on organometal halide.

The solvent of the precursor solution may dissolve the organometal halide and the quaternary ammonium salt, and may be any material as long as it is volatilized and removed easily. As a specific example, the solvent of the precursor solution may be a non-aqueous polar organic solvent. As a specific example, the non-aqueous polar organic solvent may be one or two or more selected from the group consisting of gamma-butyrolactone, formamide, N,N-dimethylformamide, diformamide, acetonitrile, tetrahydrofuran, dimethylsulfoxide, diethylene glycol, 1-methyl-2-pyrrolidone, N,N-dimethylacetamide, acetone, α-terpineol, β-terpineol, dihydroterpineol, 2-methoxyethanol, acetylacetone, methanol, ethanol, propanol, isopropanol, butanol, pentanol, hexanol, ketone, methyl isobutyl ketone, and the like.

The volatilizing and removing of the solvent may be performed by any method used to remove the liquid phase from a general solution material to obtain a solid phase in a powder form, in an agglomeration form, or a film form. Specifically, the solvent may be removed from the precursor solution by heating under reduced pressure or natural drying. As a practical example, the solvent may be removed by nozzle spraying under reduced pressure or under room temperature, or the like, but the present invention is not limited to the specific drying method.

The thermal treatment for converting the solid phase obtained by volatilizing and removing the solvent into the crystalline halide may be performed at 50 to 200° C. When the thermal treatment is performed less than 50° C., there is a risk that unreacted materials that are not converted to crystalline halide remain, and when the thermal treatment is performed at a high temperature of more than 200° C., there is a risk of causing thermal damage. More advantageously, the thermal treatment may be performed at 100 to 150° C. in view of stable and effective conversion and prevention of thermal damage.

Embodiments of the present invention include a crystalline halide fabricated by the above-described fabrication method of the crystalline halide.

Embodiments of the present invention include a fabrication method of the above-described crystalline halide film.

The fabrication method of the crystalline halide film according to embodiments of the present invention may include applying a solution of a quaternary ammonium salt satisfying Chemical Formula 1 to the organometal halide layer having a perovskite structure, followed by thermal treatment, thereby fabricating a crystalline halide film:

(Chemical Formula 1)

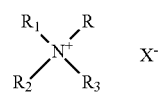

in Chemical Formula 1, R is C5-C10 alkyl, R1, R2 and R3 are each independently C1-C3 alkyl, and X is halogen. Here, X may be one or two or more selected from F, Cl, Br and I. In Chemical Formula 1, preferably all of R1, R2 and R3 may be methyl, R may be (C5-C10)alkyl, more preferably all of R1, R2 and R3 all methyl and R may be (C5-C7)alkyl.

The film may have a continuous dense film while being very thin at a thickness of 1 nm to 10 nm, specifically 3 nm to 10 nm, and the concentration of the quaternary ammonium salt in the quaternary ammonium salt solution may be 0.1 to 10 mM so that a crystalline halide film having a diffraction pattern different from that of the organic halide layer having a diffraction peak present in a region where a diffraction angle 2θ is 4° to 6° on the X-ray diffraction pattern using the Cu Kα Line.

The solvent of the solution of the quaternary ammonium salt may be any organic solvent as long as it dissolves the quaternary ammonium salt and has high volatility to be easily removed. However, in order to prevent damage to the organic halide layer as the light absorbing layer, it is advantageous that when the solution of the quaternary ammonium salt is applied, the organic halide layer is not redissolved by the solvent of the quaternary ammonium salt solution. In this respect, the solvent (first solvent) of the solution of the quaternary ammonium salt may be tert-butyl alcohol, 2-butanol, isobutyl alcohol, 1-butanol, isopropanol, 1-propanol, ethanol, methanol, a mixed solvent thereof, or the like.

Further, a mixed solvent in which a solvent (first solvent) for dissolving the quaternary ammonium salt as the solvent of the quaternary ammonium salt and a non-solvent (second solvent) for the organic halide are mixed may be used. Representative examples of the second solvent may include pentane, hexene, cyclohexene, 1,4-dioxane, benzene, toluene, triethylamine, chlorobenzene, ethylamine, ethylether, chloroform, ethyl acetate, acetic acid, 1,2-dichlorobenzene, a mixed solvent thereof, or the like. When the solvent of the quaternary ammonium salt is a mixed solvent, a content of the first solvent in the mixed solvent may be appropriately adjusted according to the concentration of the ammonium salt in the quaternary ammonium salt solution. As a specific example, when the concentration of the quaternary ammonium salt in the quaternary ammonium salt solution may be 0.1 to 10 mM, a volume ratio of the first solvent to the second solvent may be 0.001 to 0.1:1.

The solution of the quaternary ammonium salt may be applied by any method typically used for applying a liquid phase or a dispersed phase. As a specific example, the coating may be dip coating, spin coating, casting, or the like, and the printing may be screen printing, inkjet printing, hydrostatic printing, microcontact printing, imprinting, gravure printing, reverse offset printing, or gravure offset printing, or the like.

After the applying and before the thermal treatment, drying for volatilizing and removing the solvent of the applied solution of the quaternary ammonium salt may be further performed. However, when volatility of the solvent is strong, the solvent may be naturally dried in the applying process, and as the drying may be performed simultaneously in the subsequent thermal treatment step, this drying step may be optionally performed. When drying is further performed, a drying temperature may be any temperature as long as it is a temperature at which the solvent of the quaternary ammonium salt solution is volatilized off easily, and specifically, may be room temperature to 60° C., but is not limited thereto.

After the quaternary ammonium salt solution is applied, the thermal treatment for heating the applied organometal halide layer of the quaternary ammonium salt solution may be performed. It is preferable that the thermal treatment is a low temperature thermal treatment at 100 to 150° C. in order to create a smooth reaction and to prevent material damage caused by thermal energy. By this thermal treatment, a crystalline halide film, which is a reaction product between the organometal halide of the organometal halide layer and the quaternary ammonium salt satisfying Chemical Formula 1, may be fabricated in the form of a film. A time for the thermal treatment is sufficient for a stable reaction between the organometal halide and the quaternary ammonium salt. As a specific and non-limiting example, the time for the thermal treatment may be from 10 to 60 seconds.

The present disclosure includes a crystalline halide film fabricated by the fabrication method of a crystalline halide film as described above.

Embodiments of the present invention includes a fabrication method of a perovskite solar cell.

The fabrication method of the perovskite solar cell according to embodiments of the present invention includes applying a quaternary ammonium salt solution satisfying Chemical Formula 1 to an organometallic halide layer having a perovskite structure, followed by thermal treatment. That is, the fabrication method of the perovskite solar cell according to embodiments of the present invention includes fabricating a crystalline halide film stacked while forming an interface with an organometal halide layer by using the fabrication method of the crystalline halide film. Here, the crystalline halide film may correspond to the crystalline material layer of the solar cell described above. Accordingly, the fabrication method of the perovskite solar cell according to an embodiment of the present invention includes all the contents described in the fabrication method of the crystalline halide film described above, and all the contents described in the perovskite solar cell described above.

The fabrication method of the solar cell according to an embodiment of the present invention may include a) forming an electron transport structure on a first electrode; b) forming an organometal halide layer having a perovskite structure on the electron transport structure; c) applying a solution of a quaternary ammonium salt satisfying Chemical Formula 1 to the organometal halide layer, followed by thermal treatment, thereby forming a crystalline material layer; and d) forming a second electrode on the crystalline material layer. Here, when step d) is performed without a separate intermediate step after step c), as shown in (b) of FIG. 3, a solar cell in which the second electrode is directly in contact with the crystalline material layer may be fabricated. However, the present invention is not limited to this structure, and the fabrication method may further include, after step c) and before step d), e) forming a hole transport structure on the crystalline material layer. When after step e), the second electrode is formed to be in contact with an upper portion of the crystalline material layer, that is, the hole transport structure, a solar cell having the structure shown in (a) of FIG. 3 may be fabricated. In addition, when the electron transport structure is porous, step a) may include step a1) forming an electron transport film which is a dense film on the first electrode; and step a2) forming a porous electron transport structure on the electron transport film.

As described above, according to the fabrication method of the perovskite solar cell in an embodiment of the present invention, not only the light absorbing layer, which is an organometal halide layer based on solution coating may be fabricated, but also the crystalline material layer which is the crystalline halide film may also be fabricated directly on the organometal halide layer during the fabrication method of the solar cell through an extremely simple and commercially excellent method of solution application and thermal treatment.

Specifically, the electron transport film which is the dense film may be fabricated by forming a dense metal oxide film through a deposition process such as physical vapor deposition or chemical vapor deposition, and the porous electron transport structure may be fabricated by applying a slurry containing a metal oxide particle on the dense metal oxide film, and drying and thermal-treating the applied slurry layer. The slurry may be applied by any one or two or more methods selected from screen printing, spin coating, bar coating, gravure coating, blade coating, and roll coating, and the like, but the present invention is not limited thereto. An average particle size of the metal oxide particle may be 5 to 500 nm, and the thermal treatment may be performed at 200 to 600° C. in air, but is not limited thereto.

A thickness of the porous metal oxide layer fabricated by drying the applied slurry and performing thermal treatment in the forming of the porous metal oxide layer may be adjusted to be for example, 50 nm to 10 μm, more preferably 50 nm to 5 μm, and more preferably from 50 nm to 1 μm, further more preferably from 50 to 800 nm, and still further more preferably 50 to 600 nm, and even more preferably 100 to 600 nm, and most preferably from 200 to 600 nm, but is not necessarily limited thereto.

The forming of the organometal halide layer may be performed by using a solution coating method in which a solution (a light absorber solution) in which the organometal halide is dissolved as described above based on Chemical Formula 2 or a solution (a light absorber solution) containing a monovalent organic ion (A), a metal ion (M) and a halogen ion so as to satisfy the composition of Chemical Formula 2 is applied. Alternatively, the forming of the organometal halide layer may be performed using a solvent-non-solvent coating method in which a light absorber solution and a non-solvent are sequentially applied. The solution coating method and the solvent-non-solvent coating method may be performed with reference to Korean Registration Patent No. 10-1547877 or No. 10-1547870 which were filed by the present applicant. Accordingly, the present application incorporates by reference all contents disclosed in Korean Patent No. 10-1547877 or Korean Patent No. 10-1547870 related to the formation of an organometal halide layer. Alternatively, the forming of the organometal halide layer may be performed by using a method of converting a precursor of an inorganic/organic hybrid perovskite compound (an organic metal halide having a perovskite structure) containing an organic cation, a metal cation, a halogen anion and a guest molecule (GM) into the organometal halide, and the organometal halide layer using the precursor of the inorganic/organic hybrid perovskite compound may be fabricated with reference to Korean Patent Laid-Open Publication No. 2016-0090845 filed by the present applicant. Accordingly, the present disclosure incorporates by reference all contents disclosed in Korean Patent Laid-Open Publication No. 2016-0090845 relating to the formation of an organometal halide layer. Alternatively, the forming of the organometal halide layer may be performed by including forming an adduct layer containing an adduct of a halogenated metal and a guest molecule, and reacting the precursor film with an organic halide to be converted into an organic/inorganic hybrid perovskite compound (organometal halide having a perovskite structure) film, and the formation of the organometal halide layer using the adduct of the halogenated metal and the guest molecule may be performed with reference to Korean Patent Laid-Open Publication No. 2017-0026513 filed by the present applicant. Accordingly, the present disclosure incorporates by reference all contents disclosed in Korean Patent Laid-Open Publication No. 2017-0026513 relating to the formation of an organometal halide layer.

After the organometal halide layer is formed, steps of forming a second electrode or forming a hole transport structure and forming a second electrode may be performed on the organometal halide layer.

The forming of the hole transport structure may be performed by applying and drying a solution containing an organic hole transport material (hereinafter, referred to as organic hole transport solution) to cover an upper part of the organometal halide layer. A solvent used for forming the hole transport structure may be any solvent that dissolves the organic hole transport material and does not chemically react with the perovskite compound and the material of the electron transport layer. As an example, the solvent used for the forming the hole transport structure may be nonpolar solvent. As a practical example, the solvent may be any one or two or more selected from toluene, chloroform, chlorobenzene, dichlorobenzene, anisole, xylene and hydrocarbon solvents having 6 to 14 carbon atoms.

The organic hole transport material used in the forming of the hole transport structure is not limited thereto, but specifically, for example, may be one or two or more selected from a thiophene-based material, a paraphenylene vinylene-based material, a carbazole-based material and a triphenylamine-based material.

Preferably, the organic hole transport material may be any one or two or more materials selected from the thiophene-based material and the triphenylamine-based material. As a result, it is possible to obtain an photoelectric conversion efficiency that is further improved by energy matching with the light absorber having a perovskite structure. Here, as described above, the organic hole transport solution may not contain any one or two or more additives selected from TBP (tertiary butyl pyridine), LiTFSI (lithium bis(trifluoro methanesulfonyl)imide), HTFSI (bis(trifluoromethane) sulfonimide), 2,6-lutidine, and tris(2-(1H-pyrazol-1-yl)pyridine)cobalt(III), and the like, which are general additives for improving a fill factor, short-circuit current or open-circuit voltage. This is based on the remarkable improvement in photoelectric conversion efficiency by the crystalline material layer provided in embodiments of the present invention, which is because the solar cell according to an embodiment of the present invention is able to have a photoelectric conversion efficiency of 20% or more even though the hole transport structure does not contain the additive.

The second electrode may be formed through a typical metal deposition method used in a semiconductor process. As an example, the second electrode may be formed through a deposition process such as physical vapor deposition, chemical vapor deposition, or the like, and specifically, may be formed by thermal deposition.

Embodiments of the present invention include a solar cell fabricated by the fabrication method as described above.

Hereinafter, poly(3-hexylthiophene-2,5-diyl) (P3HT), which is a representative material used as a hole transport layer by necessarily adding the above-described additives since cell efficiency is low despite having excellent hole conductivity, is advantageous for large scale, and has a low cost to have excellent commerciality, is used as the organic hole transport material to fabricate the solar cell, and photoelectric conversion characteristic and stability are tested, and thus technical superiority of the present invention is experimentally demonstrated.

EXAMPLE

A glass substrate coated with fluorine-containing tin oxide (FTO: F-doped $SnO_2$, 8 ohms/$cm^2$, Pilkington, hereinafter referred to as a FTO substrate (first electrode)) was cut into a size of 25×25 mm, and ends thereof were etched to partially remove the FTO.

A 50 nm thick $TiO_2$ dense film as a metal oxide thin film was fabricated on the cut and partially etched FTO substrate by a spray pyrolysis method. The spray pyrolysis was performed by using a solution of titanium acetylacetonate (TAA):ethanol (1:9 v/v %), and the thickness was adjusted by repeating a method of spraying the solution on the FTO substrate placed on a hot plate maintained at 450° C. for 3 seconds, followed by stopping of the spraying for 10 seconds.

An ethyl cellulose solution in which 10 wt % of ethyl cellulose was dissolved in ethyl alcohol, was added to $TiO_2$ powder having an average particle size of 50 nm (fabricated by hydrothermal treatment of a titanium peroxocomplex aqueous solution having an amount of 1 wt % based on $TiO_2$ at 250° C. for 12 hours), wherein an added amount of the ethyl cellulose solution was 5 ml per 1 g of $TiO_2$ powder, and then, terpinol (5 g per 1 g of $TiO_2$ powder) was added and mixed. Then, ethanol was removed by vacuum distillation to prepare a $TiO_2$ powder paste.

The $TiO_2$ thin film of the FTO substrate was spin-coated with the prepared $TiO_2$ powder paste for 50 seconds at 2000 rpm, followed by thermal treatment at 500° C. for 60 minutes. Then, the thermal-treated substrate was immersed in a 30 mM $TiCl_4$ aqueous solution at 60° C., and allowed to leave for about 30 minutes. Then, the substrate was washed with deionized water and ethanol, dried, followed by thermal treatment at 500° C. for 30 minutes to fabricate a porous metal oxide layer having a thickness of 400 nm.

On the fabricated porous metal oxide layer, formamidinium lead iodide ($FAPbI_3$) and methylammonium lead bromide (hereinafter referred to as $MAPbBr_3$) were dissolved in 0.8 ml of N,N-dimethylformamide and 0.1 ml of dimethylsulfoxide at a molar ratio of 0.95:0.05 to prepare an organometal halide solution having a concentration of 1.4 M, and the organometal halide solution was coated on an electron transport layer, spin-coated at 1000 rpm for 10 seconds. Then, 1 ml of toluene was applied all at once in the center of rotation, followed by spin coating at 5000 rpm for 50 seconds and drying at 100° C. and atmospheric pressure condition for 1 hour, thereby forming a perovskite layer. During the formation of the perovskite layer, an ambient environment was maintained to a temperature of 25° C. and a relative humidity of 25%.

Then, on the metal halide layer, 0.35 ml of a quaternary ammonium salt solution in which (N-hexyl)trimethylammonium bromide (hereinafter referred to as HTAB) was dissolved in a mixed solvent of trichlorobenzene and isopropanol (isopropanol 3V %) at a concentration of 1.0 mM was spin-coated at 5000 rpm, followed by thermal treatment at 150° C. and atmospheric pressure for 30 seconds, thereby fabricating a crystalline halide layer.

Then, on the crystalline halide layer, a solution (10 mg P3HT/1 ml chlorobenzene) in which P3HT (poly(3-hexylthiophene-2,5-diyl)) not containing an additive was dissolved was spin-coated at 3000 rpm for 60 seconds, thereby forming a hole transport layer.

Then, Au was vacuum-deposited on the hole transport layer by a high vacuum of thermal evaporator ($5\times10^{-6}$ torr or less) to form an Au electrode (second electrode) having a thickness of 60 nm.

In order to measure the current-voltage characteristic of the fabricated solar cell, an artificial solar device (ORIEL class A solar simulator, Newport, model 91195A) and a source-meter (Kethley, model 2420) were used.

Figure 4:
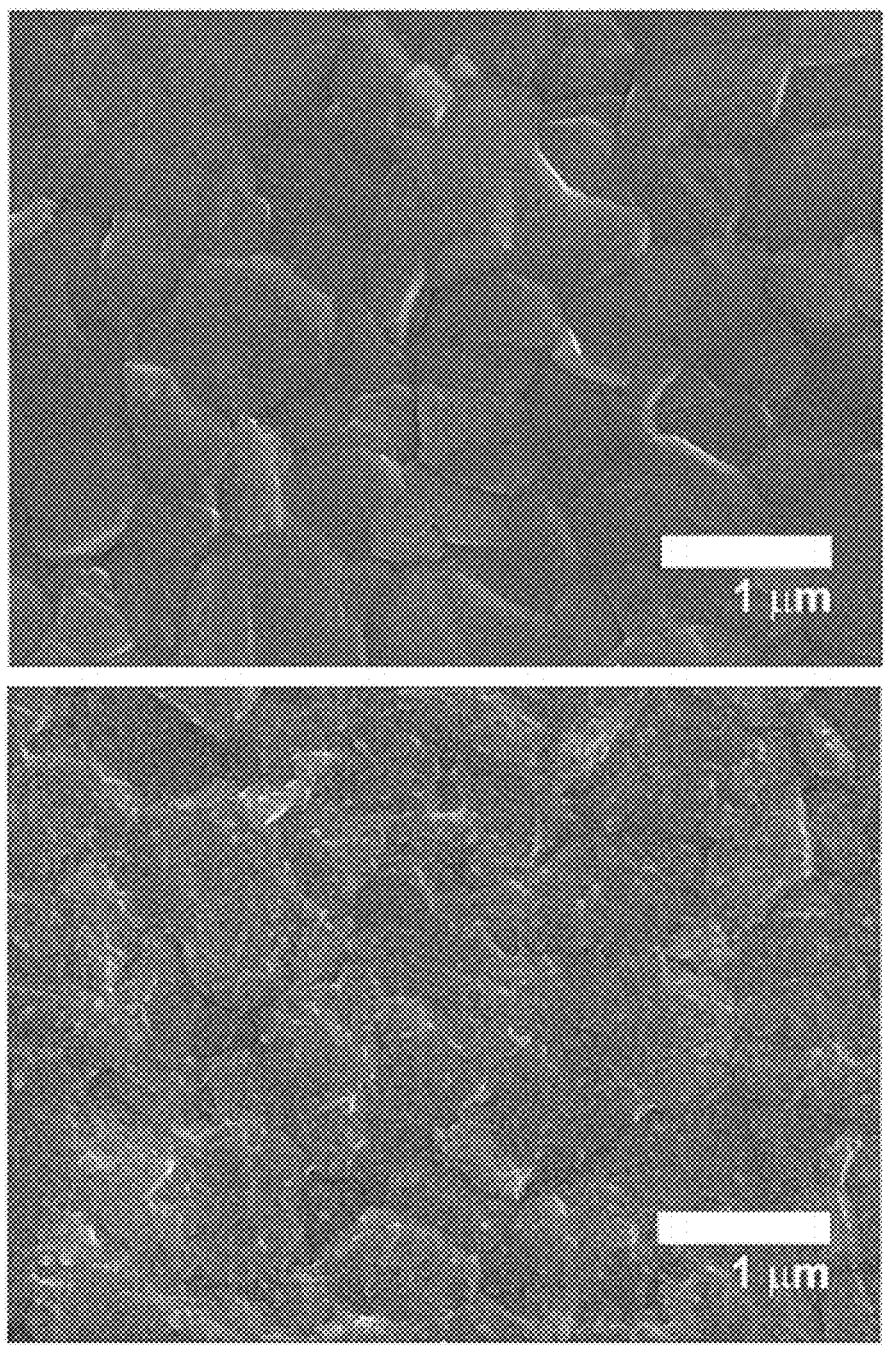
FIG. 4 is a scanning electron microscope (SEM) image of a surface of the organometal halide layer before (up) and after (bottom) reaction with a quaternary ammonium salt solution in an embodiment of the present invention.

FIG. 4 is a scanning electron microscope image showing a surface of an organometal halide layer before the quaternary ammonium salt solution was applied (upper image) and a surface of the organometal halide layer after the quaternary ammonium salt solution was applied, followed by thermal treatment (bottom image) in the Example. As shown in FIG. 4, it could be appreciated that a dense layer covering the surface of the organometal halide was newly formed by the application of the quaternary ammonium salt solution and the thermal treatment.

Figure 5:
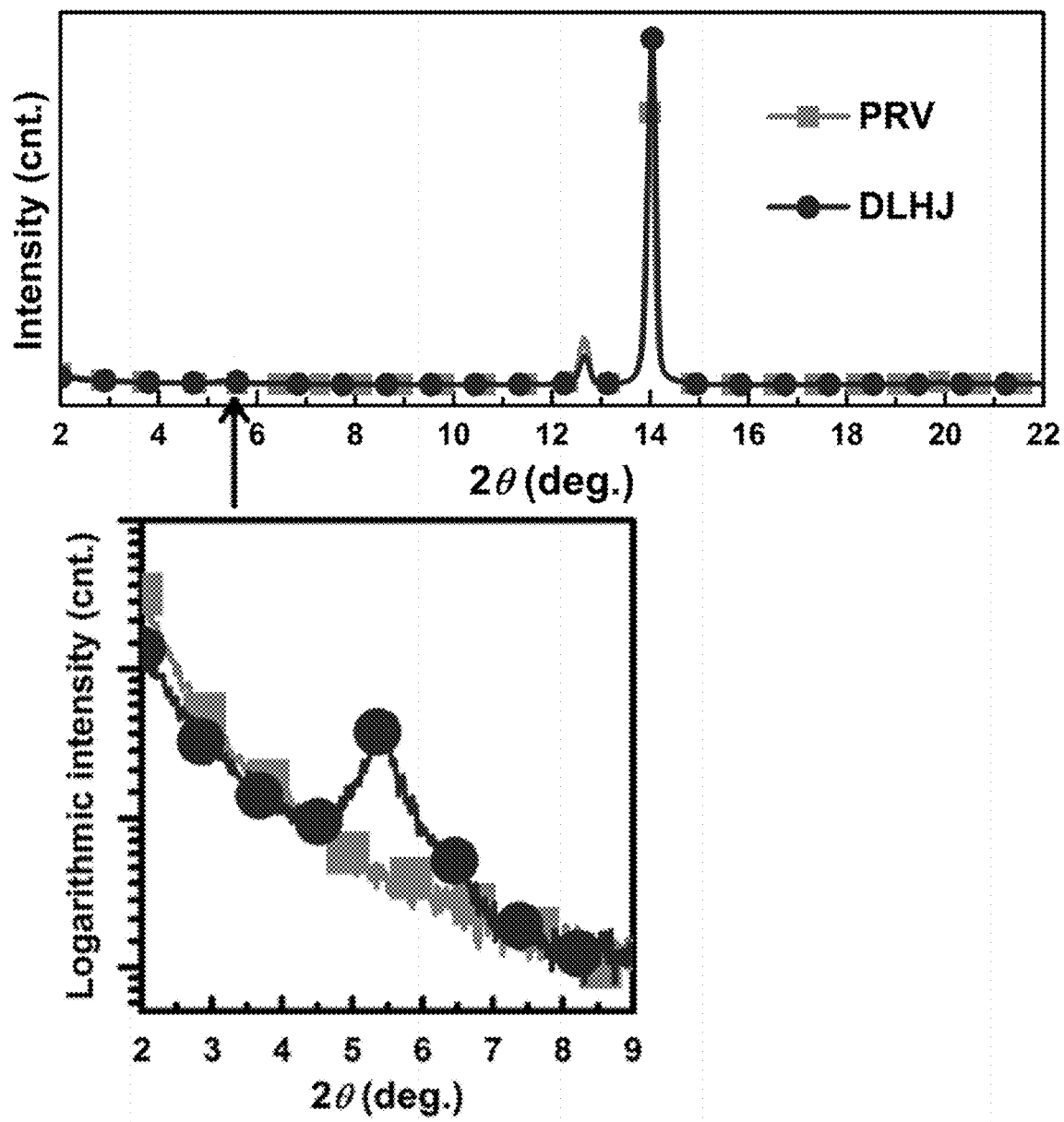
FIG. 5 shows X-ray diffraction analysis results before and after the reaction with the quaternary ammonium salt solution in an embodiment of the present invention.

FIG. 5 shows results of Cu Kα X-ray diffraction analysis before the application of the quaternary ammonium salt solution (shown as PRV in FIG. 5) and after the application and thermal treatment (shown as DLHJ in FIG. 5). As shown in FIG. 5, it could be confirmed that a new peak appears at $2\theta=5.4°$, which was different from the perovskite structure of the organometal halide.

In order to confirm the composition of the new crystal peak shown in FIG. 5, a model experiment was performed by spin coating a solution in which $FAPbI_3$ and HTAB were dissolved at a molar ratio of 1:0.2, 1:0.3, 1:0.4, 1:0.5 in a mixed solvent of trichlorobenzene and isopropanol directly on a glass substrate coated with fluorine-containing tin oxide, followed by thermal treatment in the same manner as in the Example.

Figure 6:
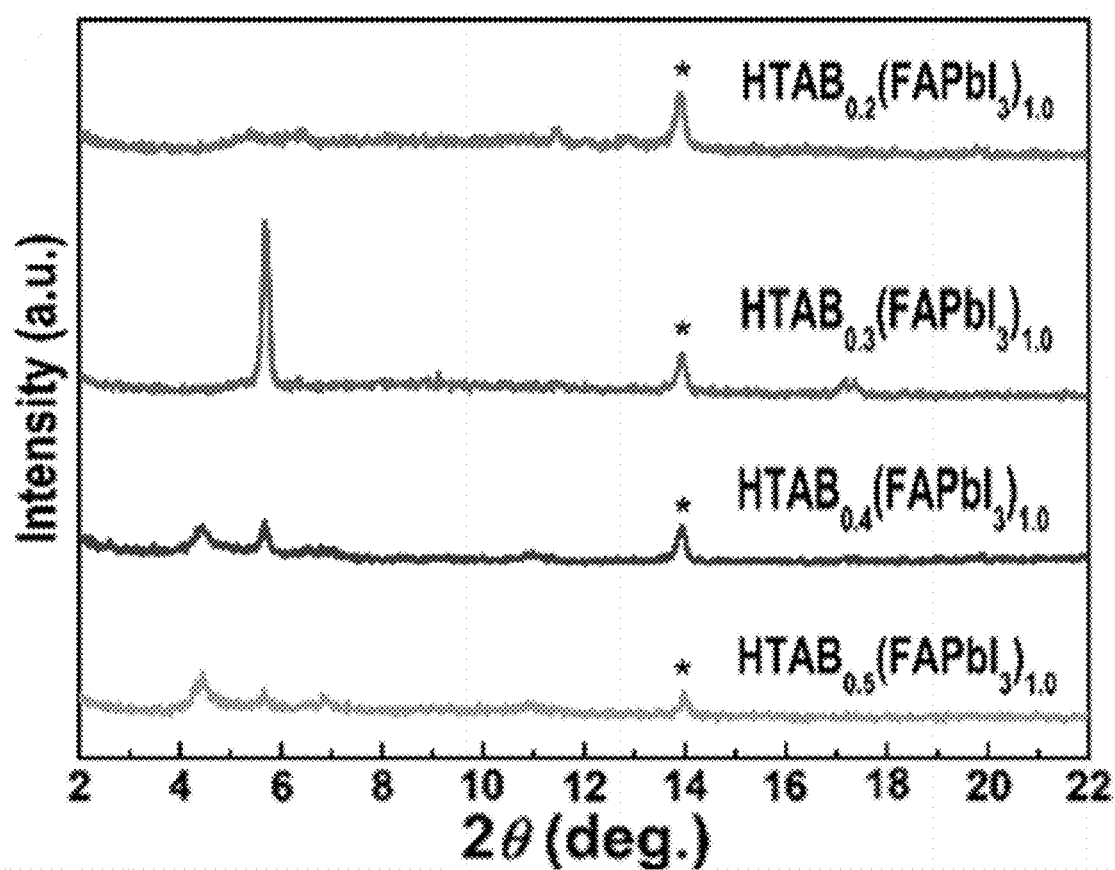
FIG. 6 shows X-ray diffraction analysis results of films fabricated by a model experiment.

FIG. 6 shows X-ray diffraction analysis results of films fabricated by the model experiment. In FIG. 6, * denotes a peak due to the substrate. In the model experiment, it could be confirmed that the new peak detected in FIG. 5 was a product of the reaction between the HTAB and the organometal halide, and that the reaction product contained 0.3 mol of HTAB per 1 mol of the organometal halide. In addition, the peak at $2\theta=5.4°$ corresponds to an interplanar spacing of 16.37 Å, which supports that the HTAB reacts with the organometal halide to form a new crystalline layer having long-range regularity as shown in the schematic diagram of FIG. 2. Further, it could be appreciated from FIG. 6 that in the case of 0.2 mol of HTAB, the peak corresponding to the new crystalline phase was detected, but the crystallinity was deteriorated, and in the case of 0.4 to 0.5 mol of HTAB, the second phase was formed.

Figure 7:
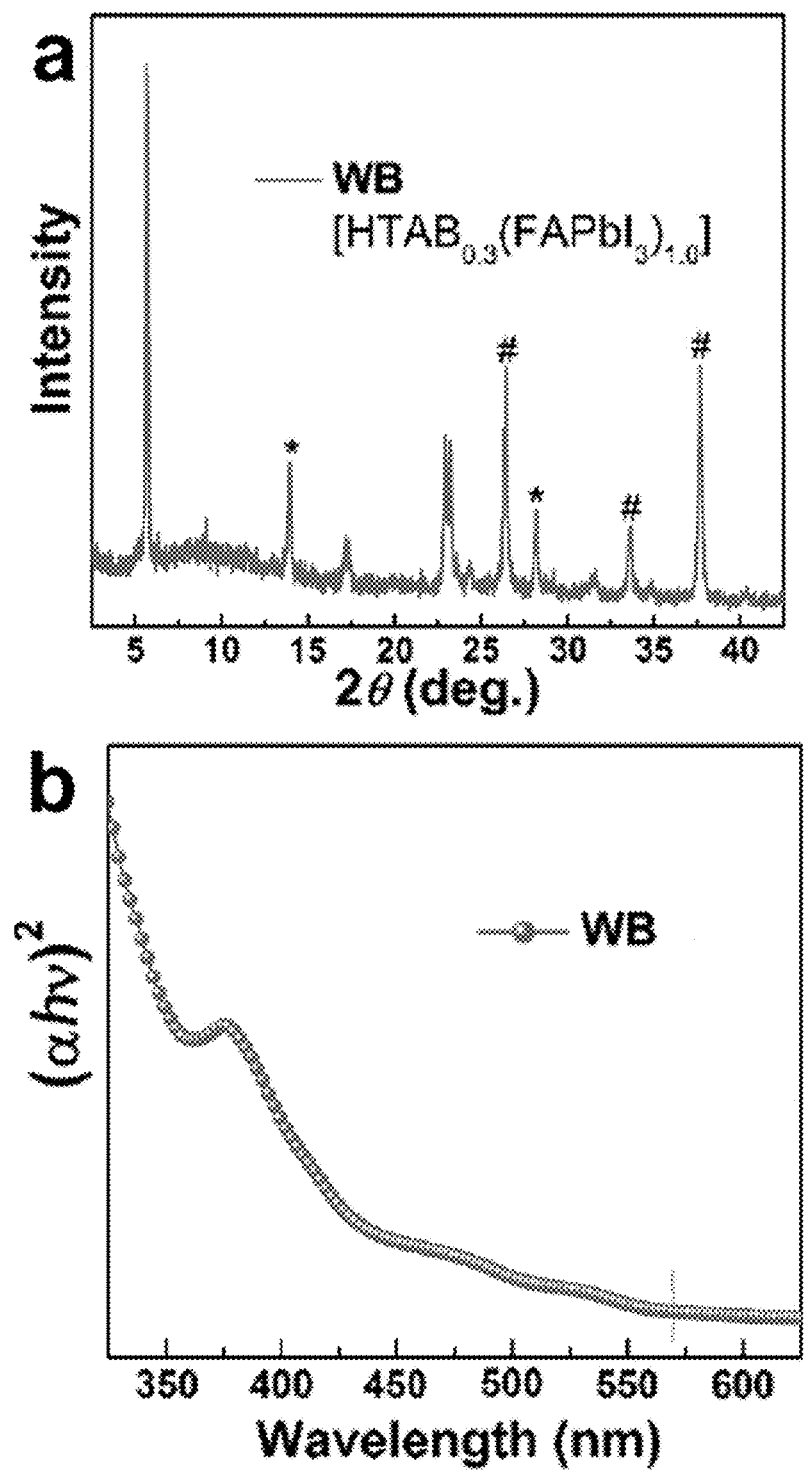
FIG. 7 shows measurement of X-ray diffraction results (a) and ultraviolet-visible light (UV-Vis) absorption spectrum (b) in 2θ range reaching 40° of the crystalline halide which is a reaction product of the organometal halide layer and the quaternary ammonium salt.

FIG. 7 shows X-ray diffraction results (a) in the $2\theta$ range of 40° of the crystalline halide, which is a reaction product containing 0.3 mol of HTAB per 1 mol of the organometal halide fabricated in Example above. Here, the peak due to the substrate was shown as #, and the perovskite was shown as *. It could be appreciated from (a) of FIG. 7 that new peaks which did not appear in the perovskite structure were disposed in the region of 16° to 18° and 22.5° to 23.5° together with the peak of 5.4°, and an intensity of the peak at 5.4° was the strongest among all the peaks.

Figure 8:
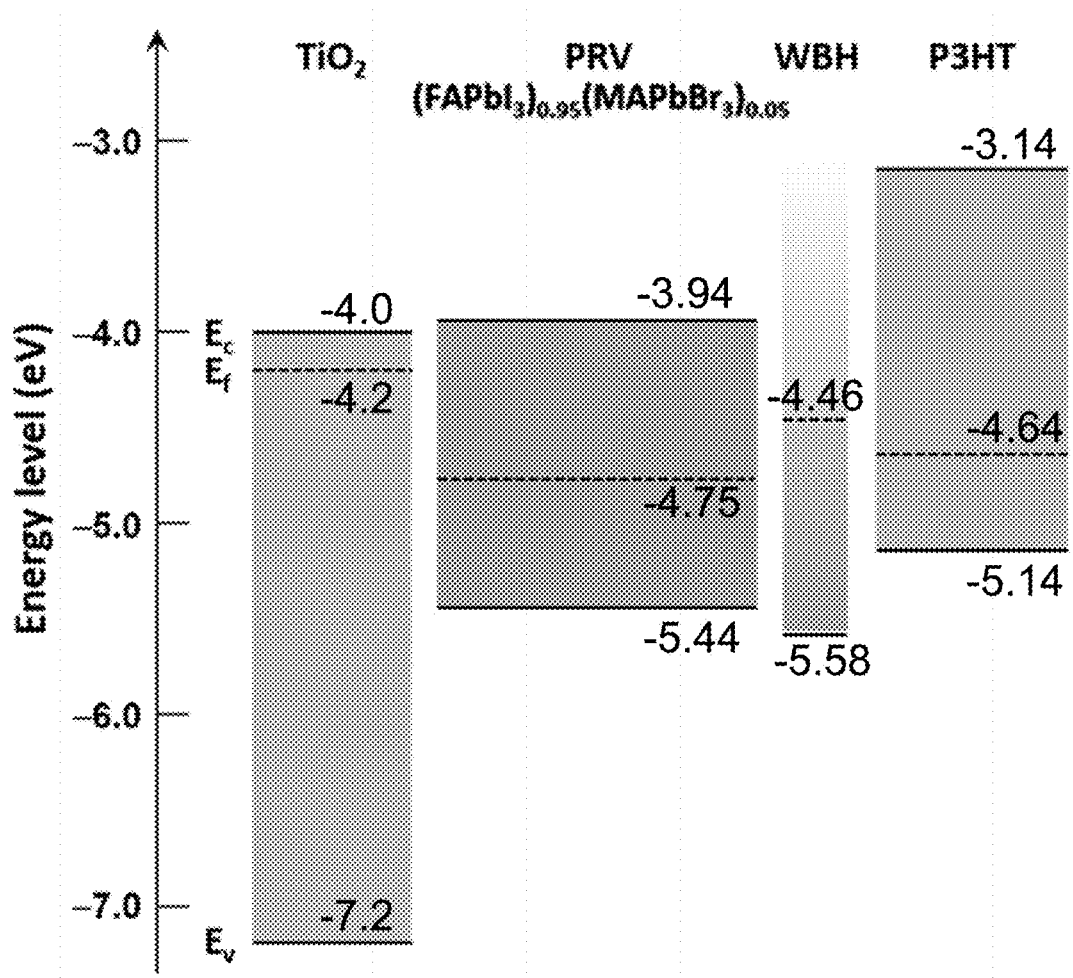
FIG. 8 shows an energy band diagram of a light absorbing layer (PRV), a crystalline halide layer (WBH), and a hole transporting layer (P3HT) in an embodiment of the present invention.

FIG. 7 shows an ultraviolet-visible (UV-Vis) absorption spectrum (b) of the crystalline halide containing 0.3 mol of HTAB per 1 mol of the organometal halide. It could be appreciated from the result of (b) of FIG. 7 that the newly formed crystalline halide layer had a very large band gap energy of 2.18 eV. The band gap energy of the organometal halide layer and hole transport layer was measured in the same manner, the valence band maximum energy level (eV)

and the highest occupied molecular orbital (HOMO) level (eV) of the crystalline halide, the organometal halide layer, and the hole transport layer were measured by ultraviolet photoelectron spectroscopy (UPS), and the conduction band minimum energy level (or LUMO level) of each layer was calculated through the valence band maximum energy level (or HOMO level) and the band gap energy. The results were shown in FIG. 8. In FIG. 8, PRV means the organometal halide layer which is the light absorbing layer of the solar cell fabricated in the Example, WBH means the crystalline halide layer of the solar cell fabricated in the Example, and P3HT means the hole transport layer of the solar cell fabricated in the Example.

The characteristics of the solar cell fabricated in the Example were evaluated. Here, a reference cell (shown as control in the drawing) was fabricated in the same manner as in the Example, but a hole transport layer was directly formed on the organometal halide layer without applying a quaternary ammonium salt solution, thereby fabricating a solar cell.

Figure 9:
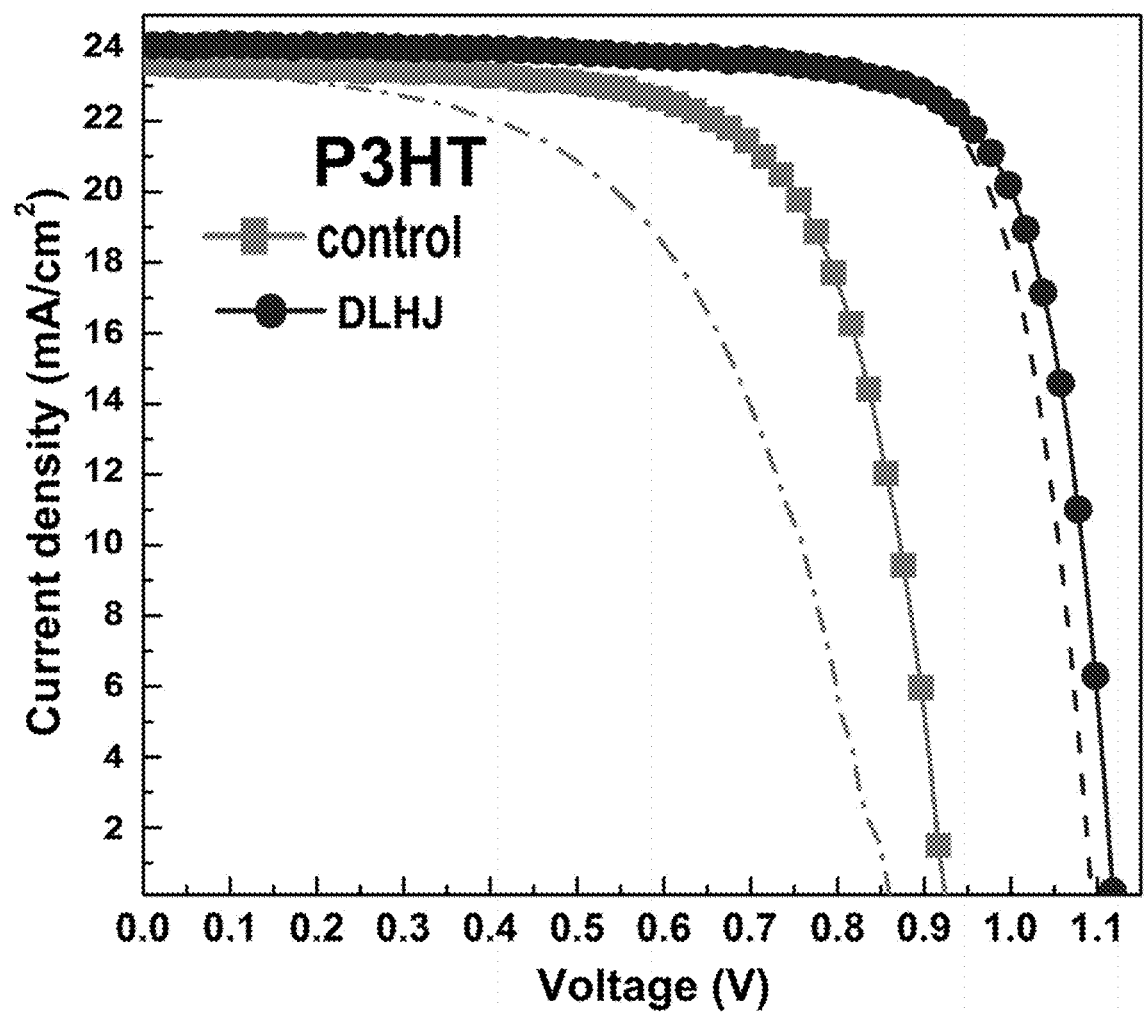
FIG. 9 shows measurement of solar cell current density-voltage (J-V) in an embodiment of the present invention.

FIG. 9 shows measurement of a current density-voltage (J-V) curve of a solar cell fabricated in the Example (shown as DLHJ) and the reference cell (shown as control) under the condition of 1.5 G (=100 mW/cm$^2$). In FIG. 9, the solid line means the result of backward scan and the dotted line means the result of the forward scan. As shown in the measurement results shown in FIG. 9, it could be appreciated that the reference cell obtained efficiency of only 15% and had a very large hysteresis in the backward scan, but the solar cell fabricated in the Example had significantly reduced hysteresis and had an efficiency of 20% or more in both of the backward and forward scans. It is noted that even though the pure P3HT hole transport layer in which the additive was not added was used, an extremely high photoelectric conversion efficiency of 20% or more was obtained. In the perovskite solar cell in which the pure hole transport material, particularly pure P3HT, was the hole transport layer, the battery efficiency of 20% or more has not been reported earlier.

As shown in FIG. 9 together with the J-V curve, it could be appreciated that based on the backward scan, the solar cell fabricated in the Example had an improved saturation current density (Jsc=24.2 mA/cm$^2$), an improved open voltage (Voc=1.11 V) and an improved fill factor (FF=0.77) as compared to those of the reference cell, thereby having 20.7% of the photoelectric conversion efficiency ($\eta$). In particular, the solar cell fabricated in the Example had the open-circuit voltage (backward scan: Voc=1.11 V, forward scan: Voc=1.09 V) that was remarkably improved than the open-circuit voltage (backward scan: Voc=0.92 V, forward scan: Voc=0.86 V) of the reference solar cell, and thus it could be appreciated that the open-circuit voltage was greatly improved by the crystalline halide layer.

Figure 10:
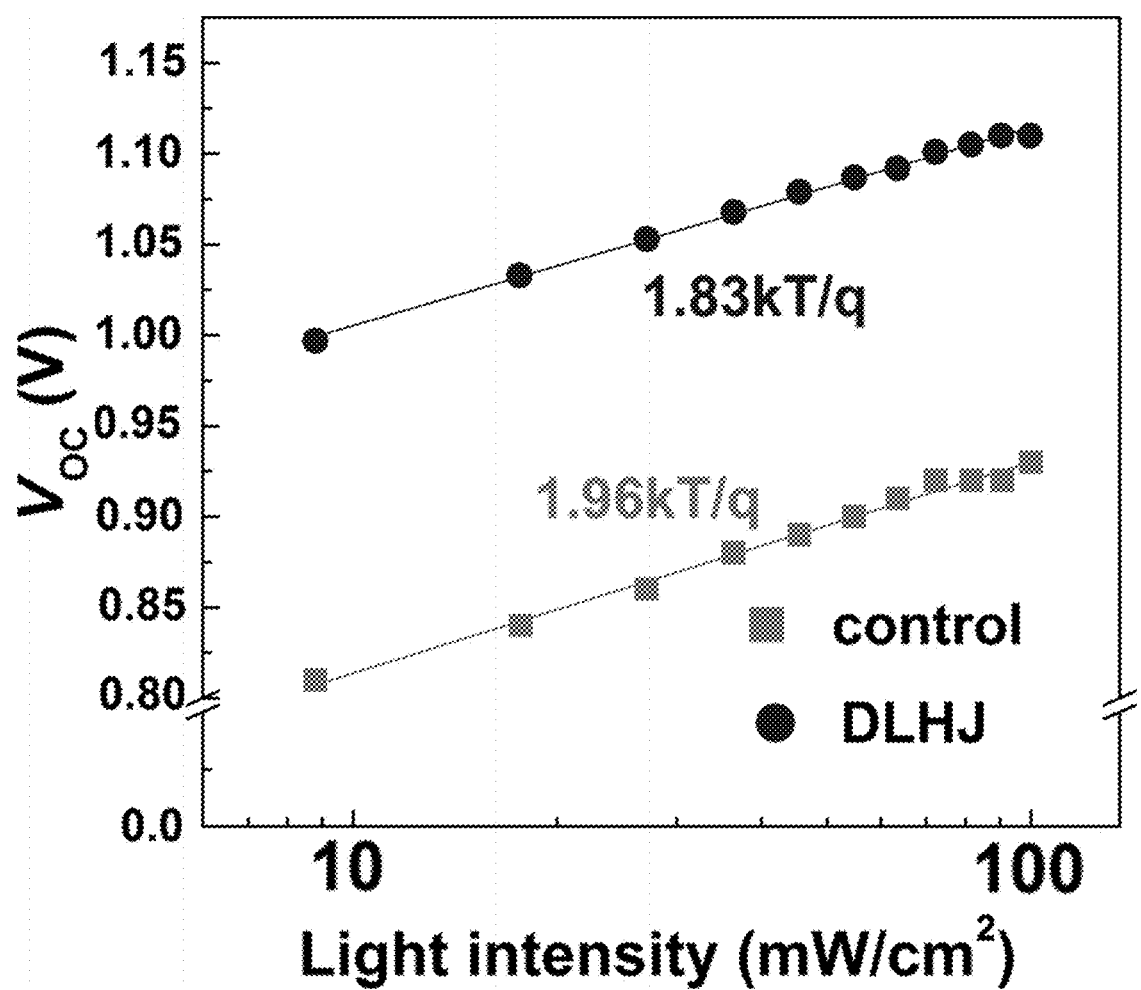
FIG. 10 shows an open-circuit voltage as compared to sunlight intensity on a semi-log scale in an embodiment of the present invention.

FIG. 10 shows an open-circuit voltage as compared to sunlight intensity on a semi-log scale. As known in the art, the slope in the light intensity of the Voc (V) versus log scale determines an ideality factor of the device. As shown in FIG. 10, the slope of the solar cell (shown as DLHJ) fabricated in the Example was 1.83 kT/q (k=Boltzman constant, T=temperature, q=electron charge quantity), and the slope of the reference cell (shown as control) was 1.96 kT/q. As a result of calculating the ideality factor through the results of FIG. 10, the ideality factor of the solar cell fabricated in the Example was 1.83, and the ideality factor of the reference cell was 1.96. Accordingly, it could be appreciated that when the crystalline halide layer was fabricated by directly (in-situ) reacting the organic halide of the organic halide layer with the quaternary ammonium salt during the solar cell fabrication process, surface defects of the organic halide layer were healed, and thus extinction by the recombination of the photoelectron and the photohole was greatly reduced.

Figure 11:
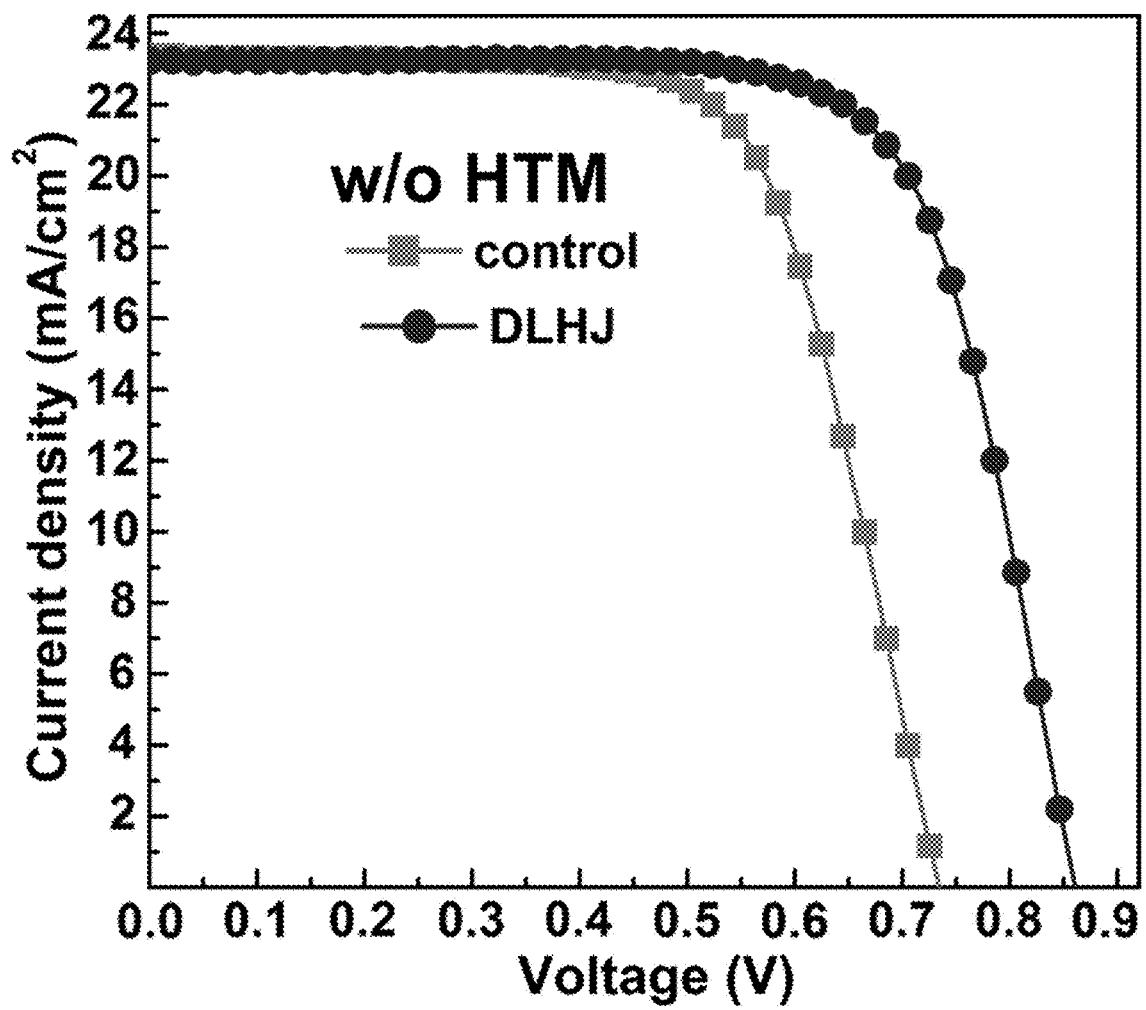
FIG. 11 shows a current density-voltage (J-V) measurement graph of a solar cell having no hole transporting layer according to an embodiment of the present invention.

FIG. 11 shows J-V curve of a solar cell (shown as DLHJ in FIG. 11) which was obtained in the same manner as the Example except that a quaternary ammonium salt solution was applied to fabricate a crystalline halide layer, and then a second electrode was directly formed on the crystalline halide layer without forming the hole transport layer. Here, for comparison, another measurement result (shown as the control in FIG. 11) of a cell in which the second electrode was formed directly on the organic halide layer without applying the quaternary ammonium salt solution was also shown. It could be appreciated from FIG. 11 that when the hole transport layer (HTM) of P3HT was not formed, the saturation current density was almost similar, i.e., 23.4 mA/cm$^2$ (control) and 23.2 mA/cm$^2$ (WB-OIH), and the fill factor also was almost similar, i.e., 0.68 (control) and 0.72 (WB-OIH), but the open-circuit voltage was 0.74 V for the control and 0.86 V for the WB-OIH, which was remarkably increased. In the solar cell experiment without the hole transport layer, the increase in the open-circuit voltage without reducing the saturation current density and the fill factor means that the recombination by the trap site and the recombination in the surface defect of the light absorbing layer were suppressed.

Figure 12:
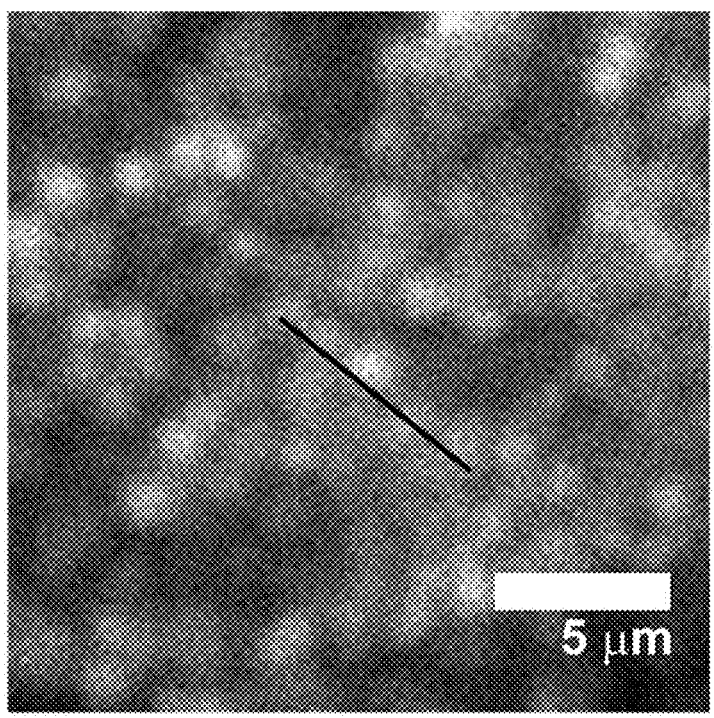
FIG. 12 shows a two-dimensional lifetime image of a solar cell in an embodiment of the present invention.
Figure 12:
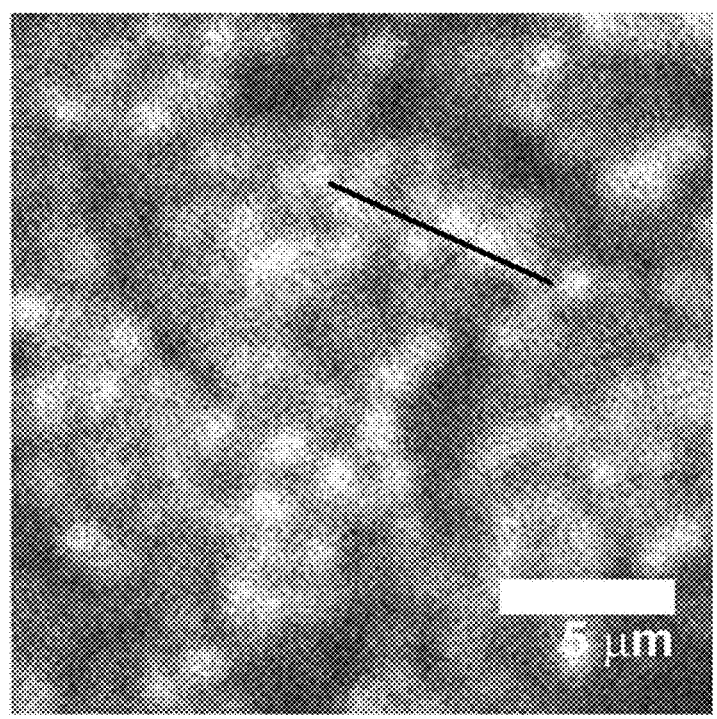
Figure 13:
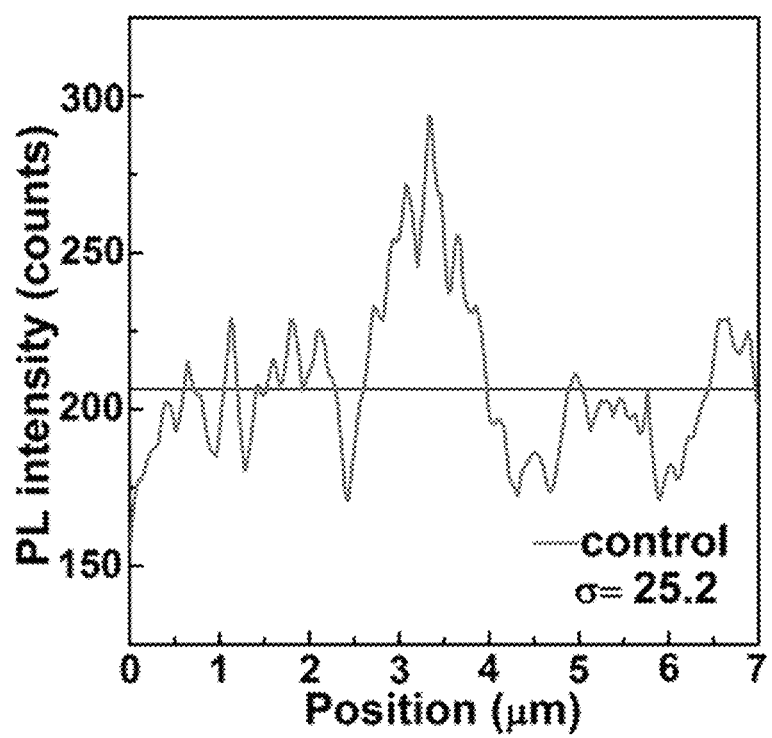
FIG. 13 shows lifetime profiles of the portions shown by the solid lines in the two-dimensional lifetime images.
Figure 13:
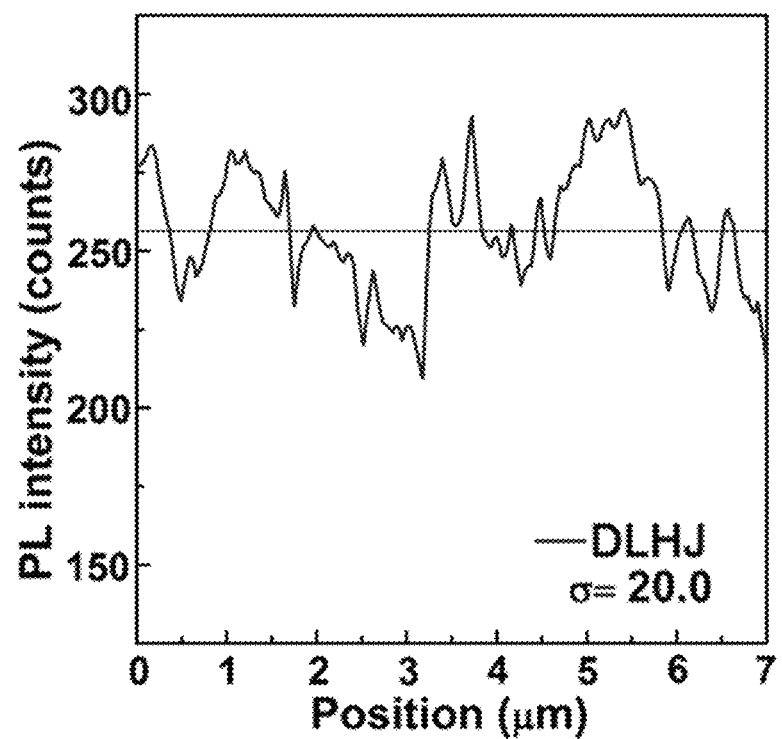
Figure 14:
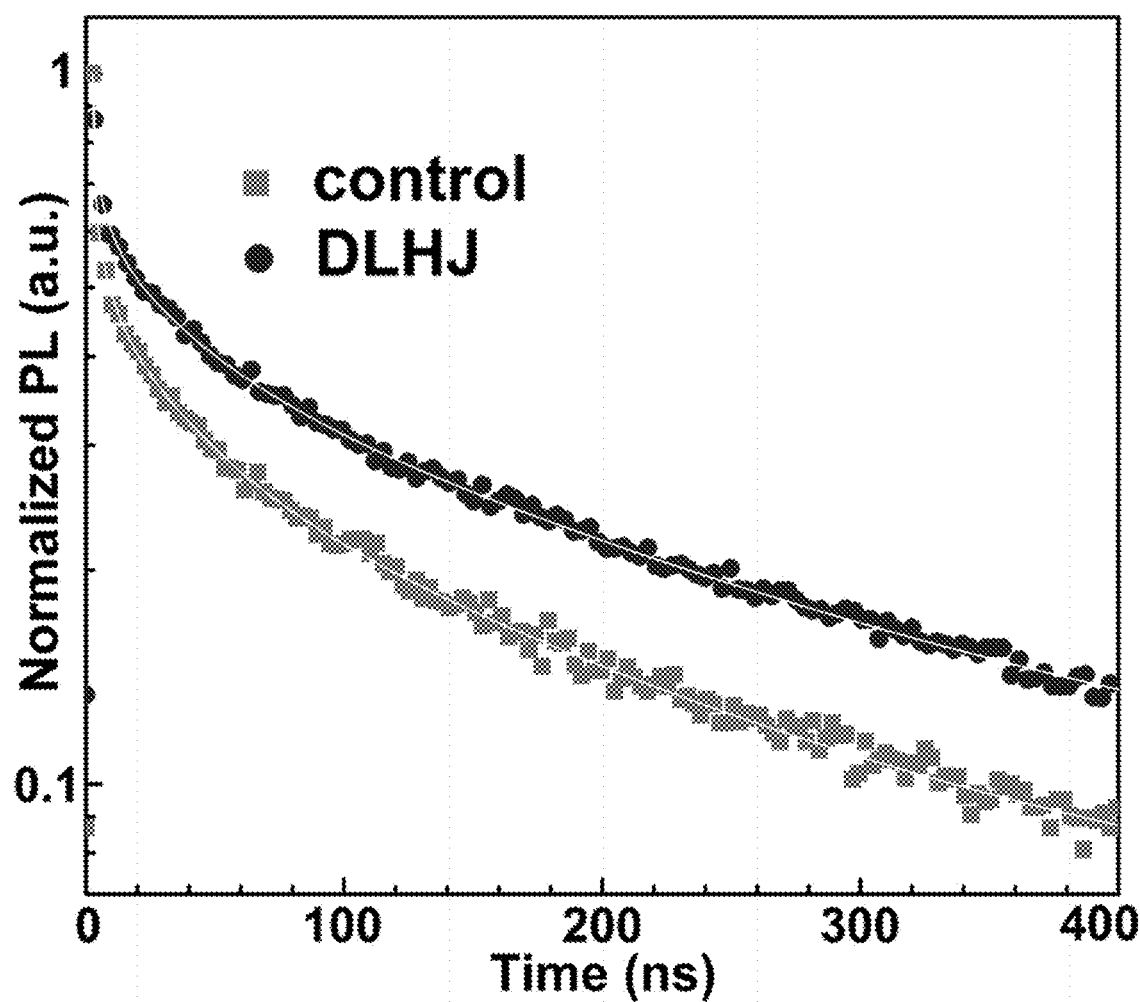
FIG. 14 shows the measurement of photoluminescence decay over time of a solar cell in an embodiment of the present invention.
Figure 15:
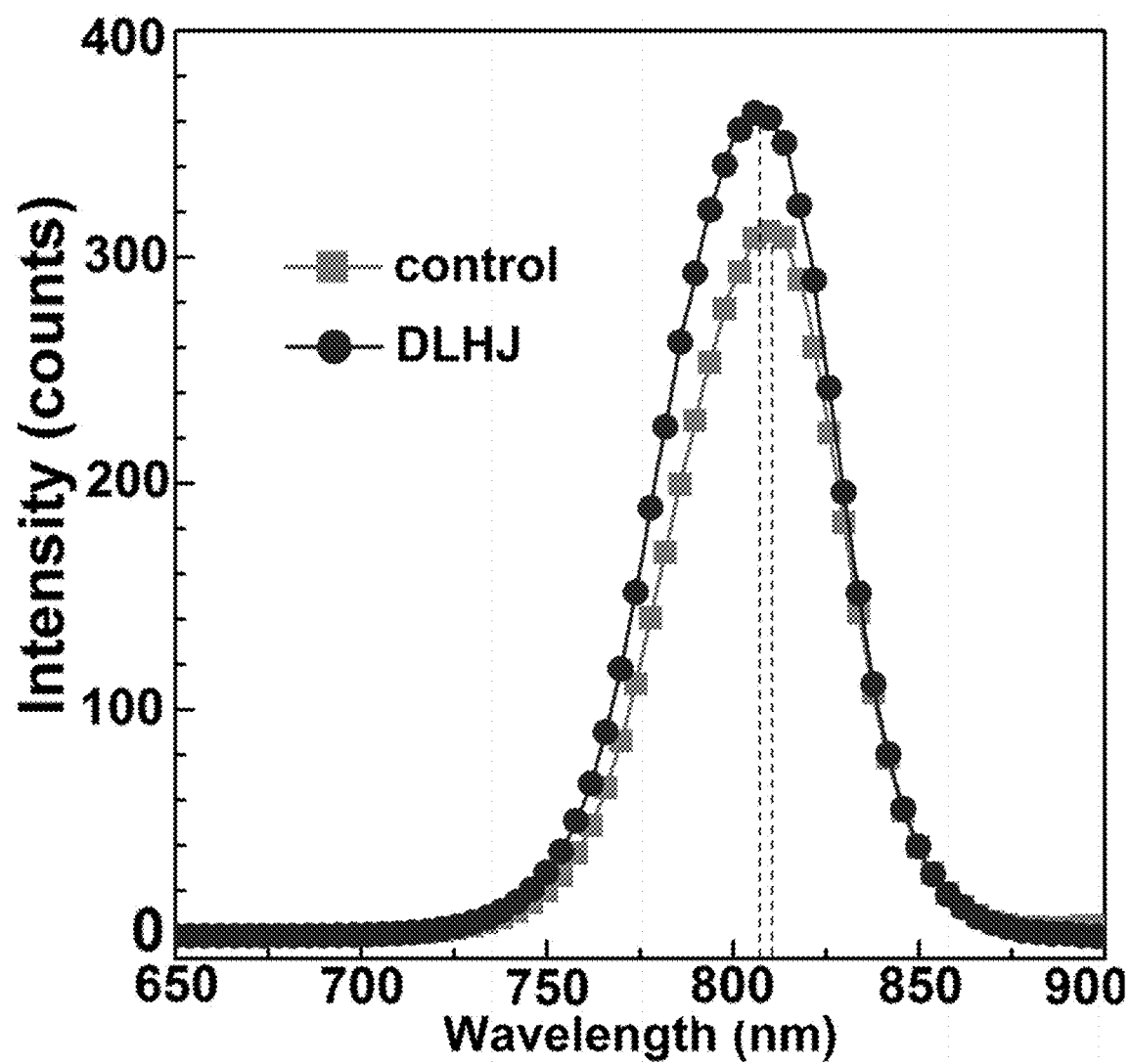
FIG. 15 shows a steady state fluorescence spectrum of a solar cell in an embodiment of the present invention.

FIG. 12 shows evaluation of fluorescent characteristics of the solar cell fabricated in the Example and the reference cell, wherein light of 470 nm was irradiated when evaluating all fluorescent properties. In detail, (a) of FIG. 12 shows a two-dimensional lifetime image of the reference cell (control), (b) of FIG. 12 shows a two-dimensional lifetime image of the solar cell (DLHJ) fabricated in the Example, and (a) and (b) of FIG. 13 show lifetime profiles of the portions shown by the solid lines in the two-dimensional lifetime images, respectively. In addition, FIG. 14 shows the measurement of photoluminescence decay over time based on an area of 20 μm×20 μm and FIG. 15 shows a steady state fluorescence spectrum.

As shown in FIG. 12 to FIG. 15, it could be appreciated that the fluorescence intensity of the solar cell (DLHJ in FIG. 13, 14, 15) fabricated in the Example of the present invention was larger than the fluorescence intensity of the reference cell, and the lifetime (carrier life time) of the solar cell (DLHJ in FIG. 13, 14, 15) fabricated in the Example of the present invention was larger than that of the reference cell in all regions. Further, it could be appreciated from the fluorescence spectrum that the solar cell fabricated in the Example of the present invention had a blue shift relative to the reference cell. It was thought that surface defects of the organometal halide layer were healed and a nonradiative recombination route was shorter.

Figure 16:
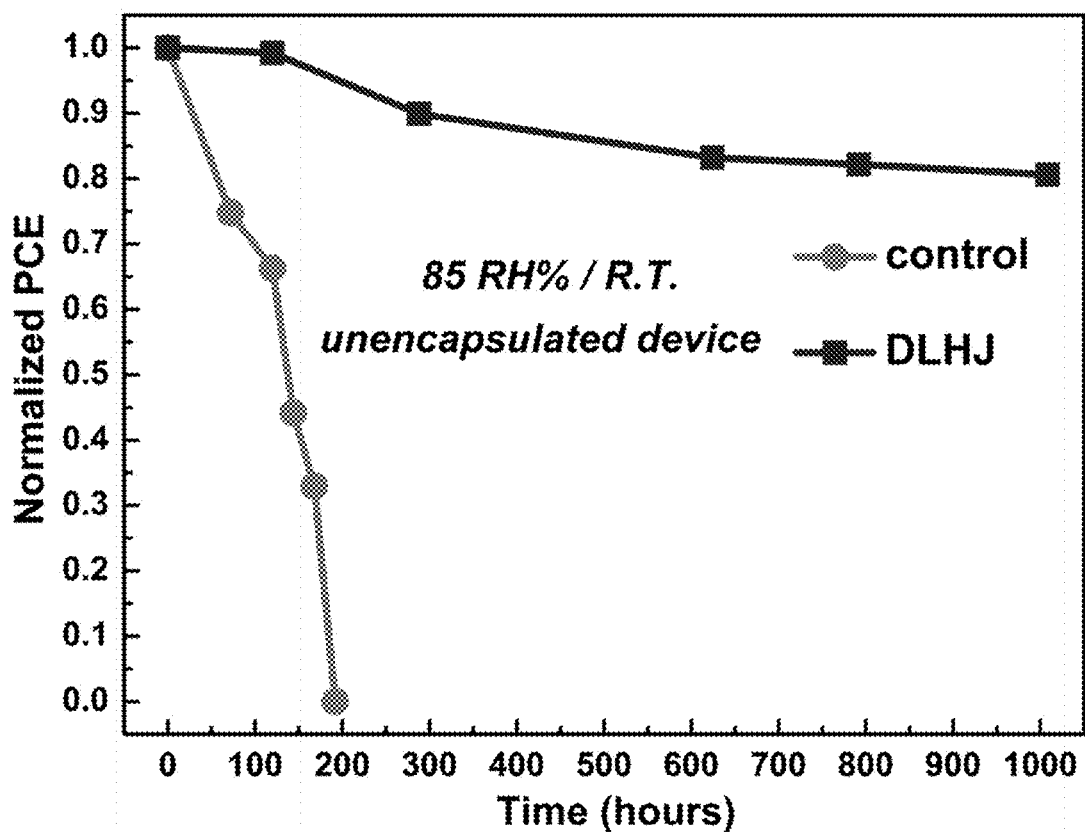
FIG. 16 shows moisture stability test results of a solar cell according to an embodiment of the present invention.

FIG. 16 shows moisture stability test results of the solar cell fabricated in the Example (the DLHJ device in FIG. 16) and the reference cell (the control device in FIG. 16). Specifically, the moisture stability test was performed by allowing the fabricated cell to stand for 336 hours at room temperature and 25% relative humidity (RH) in a dark condition as it is without being encapsulated, and then raising the relative humidity to 85% and allowing the cell to stand for 1008 hours. The cell efficiency at each time point is the average of the efficiency in the backward scan and the forward scan.

As shown in FIG. 16, it could be confirmed that both the reference cell and the solar cell fabricated in the Example exhibited excellent moisture stability under the relaxed condition of 25% relative humidity, but as the relative humidity increased to 85%, the reference cell was rapidly deteriorated due to moisture, and the function as a battery was lost within 200 hours. Surprisingly, however, it could be appreciated that the solar cell provided with the crystalline halide layer according to embodiments of the present invention maintained the efficiency of 80% based on the initial efficiency even after being exposed for 1008 hours at 85% relative humidity.

Figure 17:
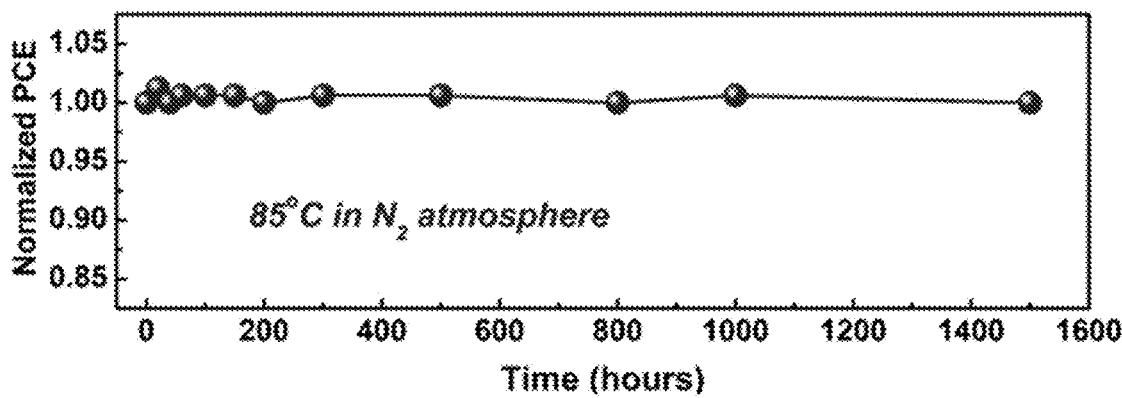
FIG. 17 shows thermal stability test results of a solar cell according to an embodiment of the present invention.

FIG. 17 shows thermal stability test results of the solar cell fabricated in the Example. Specifically, the thermal stability test was performed by allowing the cell to stand in a nitrogen-filled glove box at a temperature of 85° C. for 1500 hours. As shown in FIG. 14, surprisingly, it could be appreciated that in the solar cell according to an embodiment of the present invention, even though the heating was performed at a temperature of 85° C. for 1500 hours, the efficiency of the device did not substantially decrease.

Figure 18:
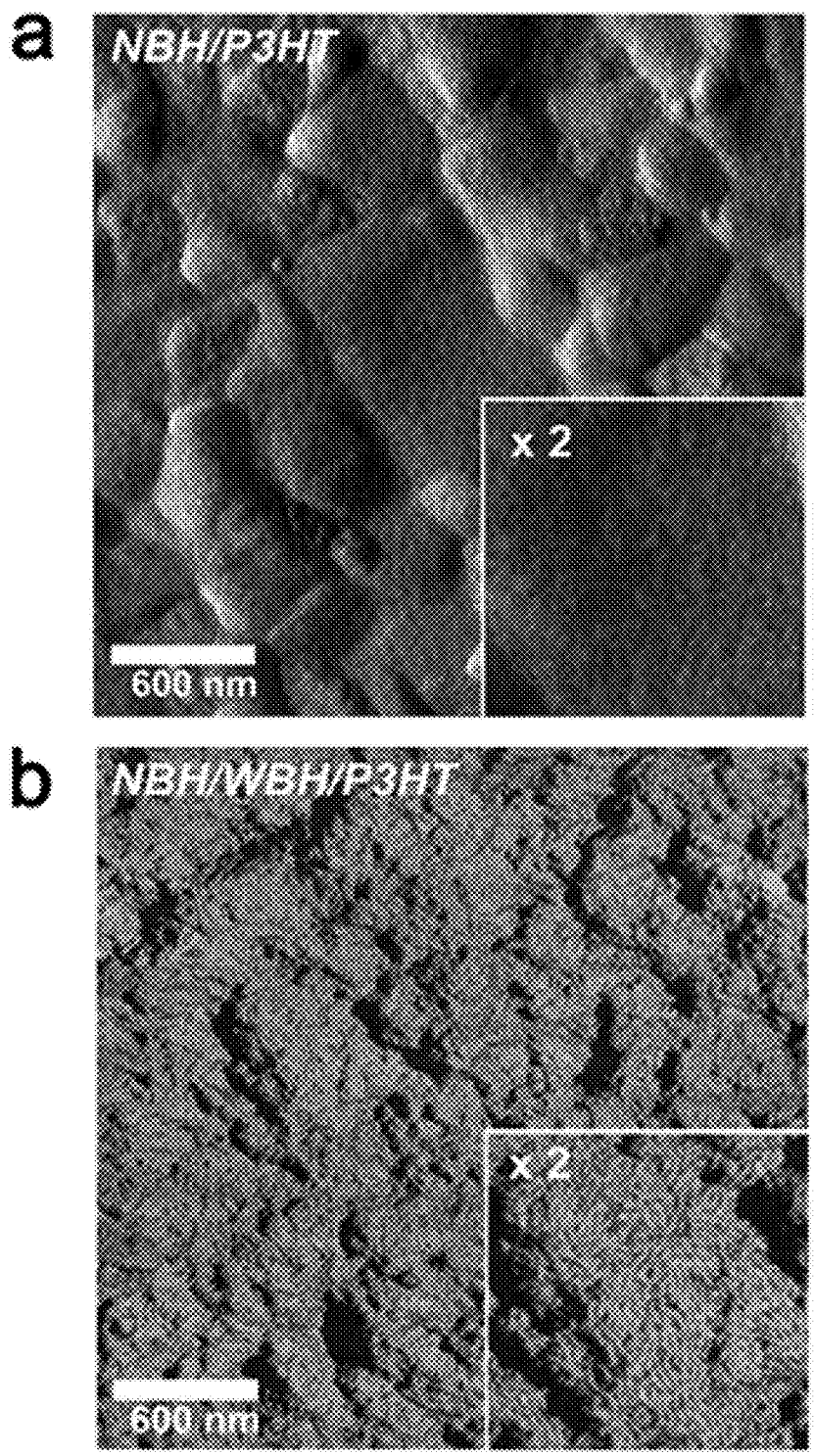
FIG. 18 is an AFM observation image of a surface of a hole transporting layer fabricated in an Example in an embodiment of the present invention.

FIG. 18 is an AFM observation image of the surface of the hole transport layer fabricated in the Example, specifically, (a) of FIG. 18 shows the surface of the hole transport layer (NBH/P3HT) which was fabricated in the same manner as in the Example, except that a hole transport layer of P3HT was formed directly on the organometal halide layer having the perovskite structure without forming the crystalline halide layer, and (b) of FIG. 18 shows the surface of the hole transport layer fabricated in the Example (NBH/WBH/P3HT). As shown in (a) of FIG. 18, it could be appreciated that when the crystalline halide layer was not present, the P3HT hole transport layer having an amorphous structure was fabricated as in the typical case. However, it could be appreciated from (b) of FIG. 18 that when the crystalline material layer according to embodiments of the present invention was present as an interfacial layer between the organometal halide layer having the perovskite structure and the hole transport layer, the crystallization of the nanofibril structure of the organic hole transport material was caused by the crystalline material layer, and that the crystalline organic hole transport layer having the nanofibril structure was fabricated.

The perovskite solar cell according to embodiments of the present invention may include the crystalline halide layer stacked while being in contact with the organometal halide layer having a perovskite structure which is a light absorbing layer, such that a battery efficiency is maintained at 80% or more even when the battery is exposed for 1008 hours at a relative humidity of 85%, thereby having an advantage of remarkably improved moisture resistance.

In addition, the perovskite solar cell according to embodiments of the present invention includes the crystalline halide layer stacked while being in contact with the organometal halide layer having a perovskite structure which is a light absorbing layer, thereby having surprisingly excellent thermal stability in which substantial deterioration of battery efficiency is prevented even when the battery is exposed to a high temperature of 85° C. for 1500 hours.

Further, the perovskite solar cell according to embodiments of the present invention may include the crystalline halide layer stacked while being in contact with the organometal halide layer having a perovskite structure which is a light absorbing layer, such that surface defects of the light absorbing layer are healed, thereby having an excellent photoelectric conversion efficiency of 20% or more even when a hole transport layer is formed of a pure organic hole transport material without containing any additive for improving characteristics at all.

As described above, the perovskite solar cell according to embodiments of the present invention may have excellent moisture and thermal stability and may implement the hole transporting layer being formed of only a low-cost organic hole transport material without containing any additive. In addition to the light absorbing layer, the crystalline halide layer may also be fabricated by an extremely simple and inexpensive process of solution coating and thermal treatment, which is very advantageous for commercialization of the perovskite solar cell.

Hereinabove, although embodiments of the present invention are described by specific matters and drawings, they are provided only for assisting in the entire understanding of the present invention. Therefore, the present invention is not limited to the embodiments. Various modifications and changes may be made by those skilled in the art to which the present invention pertains from this description.

Therefore, the spirit of the present invention should not be limited to the above-described embodiments, and the following claims as well as all modified equally or equivalently to the claims are intended to fall within the scopes and spirit of the invention.

What is claimed is:

1. A perovskite solar cell comprising:
a perovskite organometal halide layer comprising an organometal halide having a perovskite crystal structure;
a crystalline halide layer formed on the perovskite organometal halide layer wherein the crystalline halide has a crystal structure that is different from the perovskite crystal structure; and
a hole transport structure disposed on the crystalline material layer,
wherein the perovskite organometal halide layer is configured to function as a light absorbing layer, and
wherein the crystalline halide is a reaction product between a second organometal halide of the same kind as or different kind from the organometal halide of the perovskite organometal halide layer and a quaternary ammonium salt satisfying Chemical Formula 1 below:

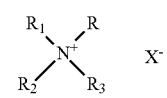

(Chemical Formula 1)

where R is C5-C7 alkyl, R1, R2 and R3 are each independently methyl, and X is halogen,
wherein the crystalline halide layer has a band gap energy higher than a band gap energy of the organometal halide of the perovskite organometal halide layer, and
wherein the crystalline halide layer has a valence band maximum energy level lower than a valence band maximum energy level of the organometal halide of the perovskite organometal halide layer.

2. The perovskite solar cell of claim 1, wherein the crystalline halide has a diffraction peak present in a region where a diffraction angle 2θ is 4° to 6° on an X-ray diffraction pattern using a Cu Kα line.

3. The perovskite solar cell of claim 1, wherein in Chemical Formula 1, R1, R2, and R3 are each methyl.

4. The perovskite solar cell of claim 1, wherein the crystalline halide contains 0.2 to 0.4 mol of the quaternary ammonium salt relative to 1 mol of the second organometal halide.

5. The perovskite solar cell of claim 1, wherein the second organometal halide is the same kind as the organometal halide of the perovskite organometal halide layer, and the reaction product is fabricated by applying a solution of the quaternary ammonium salt to the perovskite organometal halide layer, followed by thermal treatment.

6. The perovskite solar cell of claim 1, wherein the crystalline halide has a band gap energy of 2.00 to 2.50 (eV).

7. The perovskite solar cell of claim 1, wherein the crystalline halide layer has a thickness of 1 nm to 10 nm.

8. The perovskite solar cell of claim 1, further comprising:
    an electron transport structure disposed under the perovskite organometal halide layer.

9. The perovskite solar cell of claim 8, further comprising:
an electrode disposed on the crystalline halide layer, wherein the hole transport structure is interposed between the electrode and the crystalline halide layer.

10. The perovskite solar cell of claim 1,
    wherein the hole transport structure comprises polyalkyl C4-C8 thiophene having a crystalline nanofibril structure.

* * * * *